(12) United States Patent
Hayashi

(10) Patent No.: US 8,952,250 B2
(45) Date of Patent: Feb. 10, 2015

(54) CONNECTION STRUCTURE AND CONNECTION METHOD FOR SUPRRESSING RADIATION OF COMMON NOISE IN A SUPERIMPOSED WIRING MEMBER

(75) Inventor: Katsuhiko Hayashi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 137 days.

(21) Appl. No.: 13/530,502

(22) Filed: Jun. 22, 2012

(65) Prior Publication Data

US 2012/0325550 A1    Dec. 27, 2012

(30) Foreign Application Priority Data

Jun. 22, 2011  (JP) ................. 2011-138239
Aug. 25, 2011  (JP) ................. 2011-183379

(51) Int. Cl.
H05K 9/00   (2006.01)
H05K 1/02   (2006.01)
H05K 1/14   (2006.01)

(52) U.S. Cl.
CPC ............ *H05K 1/0219* (2013.01); *H05K 9/0064* (2013.01); *H05K 1/0228* (2013.01); *H05K 1/147* (2013.01); *H05K 2201/09236* (2013.01)
USPC .................. 174/32; 174/70 R; 174/33; 174/34

(58) Field of Classification Search
CPC ...... H01L 24/48; H01L 24/49; H05K 1/0216; H05K 1/181; H05K 1/182; H05K 1/0215; H05K 1/20; H05K 1/2009; H05K 2201/02936; H05K 2201/09781; H05K 3/32; H05K 1/0219; H05K 1/0228; H05K 9/0064; H05K 1/147; H05K 2201/09236
USPC ....... 174/70, 68.1, 333, 110 R, 113 R, 33, 32, 174/34, 3, 70 R See application file for complete search history.

(56) References Cited

U.S. PATENT DOCUMENTS

| | | | | |
|---|---|---|---|---|
| 4,939,315 A | * | 7/1990 | Palmer ........................... | 174/36 |
| 4,945,189 A | * | 7/1990 | Palmer ........................... | 174/32 |
| 5,064,966 A | * | 11/1991 | Palmer ........................... | 174/32 |
| 5,113,159 A | * | 5/1992 | Adriaenssens et al. ......... | 333/12 |
| 5,376,902 A | * | 12/1994 | Bockelman et al. ............. | 333/5 |
| 5,471,010 A | * | 11/1995 | Bockelman et al. ............ | 174/36 |
| 5,680,297 A | * | 10/1997 | Price et al. ..................... | 361/818 |
| 6,265,655 B1 | * | 7/2001 | Schweighofer ................. | 174/32 |
| 7,026,545 B2 | * | 4/2006 | Barr et al. ....................... | 174/33 |
| 7,292,449 B2 | * | 11/2007 | Hall et al. ....................... | 361/749 |
| 7,446,258 B1 | * | 11/2008 | Sosna et al. .................... | 174/33 |
| 7,541,538 B1 | * | 6/2009 | Sosna et al. .................... | 174/33 |

(Continued)

FOREIGN PATENT DOCUMENTS

| | | |
|---|---|---|
| JP | 2006-191006 A | 7/2006 |
| JP | 2007-242745 A | 9/2007 |
| JP | 2007-311709 A | 11/2007 |

*Primary Examiner* — Lisa Lea Edmonds
*Assistant Examiner* — Keith Depew
(74) *Attorney, Agent, or Firm* — Maschoff Brennan

(57) ABSTRACT

When a GND electrode of a main board is connected to a GND electrode of a daughter board by a flat cable, an end portion of one side of a first GND line is connected to the GND electrode of the main board and an end portion of the other side of the first GND line is connected to the GND electrode of the daughter board. An end portion of one side of a second GND line is insulated from a circuit of the main board and an end portion of the other side of the second GND line is connected to the GND electrode of the daughter board.

16 Claims, 13 Drawing Sheets

(56) References Cited

U.S. PATENT DOCUMENTS

2006/0123174 A1* 6/2006 Nguyen et al. .............. 710/301
2006/0125571 A1 6/2006 Hamada et al.
2010/0258333 A1* 10/2010 Horan et al. .................. 174/78
2013/0312992 A1* 11/2013 Guetig et al. ................. 174/34

* cited by examiner

CONNECTION STRUCTURE AND CONNECTION METHOD FOR SUPRRESSING RADIATION OF COMMON NOISE IN A SUPERIMPOSED WIRING MEMBER

CROSS REFERENCES TO RELATED APPLICATIONS

The present invention contains subject matter related to Japanese Patent Application Nos. 2011-138239 filed in the Japanese Patent Office on Jun. 22, 2011 and 2011-183379 filed on Aug. 25, 2011, the entire contents of which are incorporated herein by reference.

BACKGROUND

1. Technical Field

The present invention contains subject matter related to Japanese Patent Application Nos. 2010-258650 filed in the Japanese Patent Office on Nov. 19, 2010 and 2010-258652 filed on Nov. 19, 2010, the entire contents of which are incorporated herein by reference.

The present invention relates to a connection structure and a connection method.

2. Related Art

In recent years, to reduce the space occupied as an installation place, printing apparatuses such as printers have been miniaturized while ensuring an inner space for reception of a sheet to be printed. The functions of a printing apparatus are controlled by a circuit board called a main board. However, there is also a demand for miniaturizing the main board as the printing apparatus is miniaturized.

To meet this demand, the main board does not provide all of the functions, but provides only main functions. A sub-board (daughter board) provides the functions of the printing apparatus, as in an operation panel operated by a user or a card reader such as a memory. This daughter board is efficiently disposed inside the printing apparatus. The daughter board and the main board are electrically connected to one another via a harness or a wiring member such as a ribbon cable or a flexible flat cable (FFC).

In general, power or an electric signal is transmitted through a transmission line formed by a pair of conductive lines. In an electronic apparatus, one of the pair of conductive lines is set to have a potential with the same level as a ground (GND) of a casing. At this time, since currents flow in opposite directions in one pair of conductive lines of the transmission line, magnetic fields formed by the conductive lines are cancelled by one another, and thus the magnetic field of the transmission line to the outside is not formed. Accordingly, there is no influence of noise radiated to the outside (hereinafter, this transmission type is referred to as a normal mode).

On the other hand, when currents flow in the same direction (same phase) in a pair of conductive lines, the currents are interpreted as returning to a noise source by stray capacitance of a space or the like (hereinafter, this transmission type is referred to as a common mode). When noise (common mode noise) in the common mode has a level in which the noise is returned to the noise source via the space stray capacitance or the like, the amount of current is very small. Therefore, there is generally no problem of EMC (Electromagnetic Compatibility). However, when coupling with a space occurs by resonance or the like, the energy of the noise flows out to the space, and thus the noise current increases. As a result, a problem with EMC occurs since the noise may not be suppressed to a level equal to or less than a regulated noise radiation level.

For example, when the main board and the daughter board are connected by a wiring member, a common mode is formed in a signal line and a GND line due to mismatch or the like between transmission impedance and signal impedance of wiring patterns or wiring members to be used in connector sections of the boards. Further, in the wiring member, the common mode noise flows in a power line in addition to the signal line and the GND line via a bypass capacitor between the GND and a power source. In some cases, noise with the same phase may be superimposed one another in many lines of the wiring member including the signal line, the power line, and the GND line.

Further, when the length of the wiring member approximates a quarter or half of the equivalent wavelength of the superimposed noise, the noise (high-frequency) current resonates in the length direction of the wiring member and couples with a space, and thus the noise is radiated to the outside. At this time, since the high-frequency current radiated sequentially from the noise source is supplied with the same phase to each line of the wiring member, noise with a level exceeding the regulation value of noise regulation of an apparatus is radiated.

A countermeasure of the common mode noise is necessary, but it is difficult for an LCR circuit that includes a resistor, a coil, and a capacitor to implement a countermeasure since the noise with the same phase is superimposed in the power line, the signal line, or the GND line. Therefore, when the common mode noise is superimposed in the wiring member, the wiring member is tightly pressed on a casing ground, as disclosed in JP-A-2007-311709, or a common mode choke or a ferrite core is inserted, as disclosed in JP-A-2006-191006, to prevent the transmission of the common mode noise or suppress radiation of the common mode noise toward a space.

However, this structure is configured on the assumption that the casing ground is provided in the vicinity of the wiring member, and thus this structure may cause large restriction on the degree of freedom of product design. Further, the volume of the ferrite core is necessarily large to obtain a sufficient effect of the countermeasure of the ferrite core or the like and a member that fixes the ferrite core is necessarily prepared and provided inside the product casing. Furthermore, since it is necessary to perform a work of winding the wiring member around the ferrite core, considerable difficulty and cost are caused in the assembling process.

SUMMARY

An advantage of some aspects of the invention is that it provides a technology of suppressing radiation of common mode noise superimposed in a wiring member at low cost and with a simple structure.

The application examples are realized as follows.

APPLICATION EXAMPLE 1

According to Application Example 1, there is provided a connection structure in which a wiring member including a plurality of conductive lines electrically connects a first device to a second device. An end portion of one side of a first conductive line of the wiring member is connected to a first electrode of the first device and an end portion of the other side of the first conductive line is connected to a first electrode of the second device. An end portion of one side of a second conductive line of the wiring member is electrically insulated from a circuit of the first device and an end portion of the other side of the second conductive line is connected to the first electrode of the second device.

In the connection structure, when common mode noise occurs on the side of the first device and is transferred from the first electrode of the first device to the first electrode of the second device along the first conductive line of the wiring member, a high-frequency current flowing in an opposite direction (anti-parallel direction) to the direction of the high-frequency current of the common mode noise flowing in the first conductive line flows in the second conductive line of the wiring member since the end portion of the one side of the second conductive line of the wiring member is electrically insulated on the side of the first device and the end portion of the other side of the second conductive line is connected to the first electrode of the second device. At this time, since a relation in which radiated electromagnetic fields generated from the first and second conductive lines are cancelled is established, the radiation of the common mode noise is suppressed. Accordingly, when the wiring member includes the second conductive line, the radiation of the common mode noise can be suppressed with ease and at low cost.

APPLICATION EXAMPLE 2

In the connection structure according to Application Example 1, it is preferable that each of the first electrode of the first device and the first electrode of the second device is a ground electrode and the first conductive line of the wiring member is a ground line.

In the connection structure, a countermeasure of the radiated noise is effective, since the common mode noise is transferred via the ground line of the wiring member in many cases.

APPLICATION EXAMPLE 3

In the connection structure according to Application Example 1, it is preferable that the second conductive line is disposed in one of outermost portions in a width direction with respect to a length direction of the wiring member.

In the connection structure, since the end portion of the one side of the second conductive line is electrically opened, the high-frequency current does not flow in a portion closer to the end portion, and thus a high-frequency magnetic field formed outside the second conductive line is reduced. Therefore, by disposing the second conductive line in one of the outermost portions in the width direction with respect to the length direction of the wiring member in which the resistance of the generation of the high-frequency magnetic field is small by another conductive line of the wiring member, it is possible to maximize an effect of cancelling the high-frequency magnetic fields generated in the first conductive line. The noise radiation from the wiring member can be reduced more efficiently due to this effect.

APPLICATION EXAMPLE 4

According to Application Example 4, there is provided a connection structure in which a wiring member including a plurality of conductive lines electrically connects a first device to a second device. An end portion of one side of a first conductive line of the wiring member is connected to a first electrode of the first device and an end portion of the other side of the first conductive line is connected to a first electrode of the second device. An end portion of one side of a second conductive line of the wiring member is electrically insulated from a circuit of the first device and an end portion of the other side of the second conductive line is connected to the first electrode of the second device. An end portion of one side of a third conductive line of the wiring member is connected to the first electrode of the first device and an end portion of the other side of the third conductive line is electrically insulated from a circuit of the second device.

In the connection structure, when the common mode noise occurs on the side of the first device and is transferred from the first electrode of the first device to the first electrode of the second device along the first conductive line of the wiring member, a high-frequency current flowing in the opposite direction (anti-parallel direction) to the direction of the high-frequency current of the common mode noise flowing in the first conductive line flows in the second conductive line of the wiring member since the end portion of the one side of the second conductive line of the wiring member is electrically insulated on the side of the first device and the end portion of the other side of the second conductive line is connected to the first electrode of the second device. At this time, since a relation in which radiated electromagnetic fields generated from the first and second conductive lines are cancelled is established, the radiation of the common mode noise is suppressed. Likewise, when the common mode noise occurs on the side of the second device and is transferred from the first electrode of the second device to the first electrode of the first device along the first conductive line of the wiring member, a high-frequency current flowing in the opposite direction (anti-parallel direction) to the direction of the high-frequency current of the common mode noise occurring on the side of the second device and flowing in the first conductive line flows in the third conductive line of the wiring member since the end portion of the other side of the third conductive line of the wiring member is electrically insulated on the side of the second device and the end portion of the one side of the third conductive line is connected to the first electrode of the first device. At this time, since a relation in which radiated electromagnetic fields generated from the first and third conductive lines are cancelled is established, the radiation of the common mode noise occurring from the second device is also suppressed. Accordingly, when the wiring member includes the second and third conductive lines, the radiation of the common mode noise can be suppressed with ease and at low cost irrespective of the device from which the common mode noise occurs.

APPLICATION EXAMPLE 5

In the connection structure according to Application Example 4, it is preferable that each of the first electrode of the first device and the first electrode of the second device is a ground electrode and the first conductive line of the wiring member is a ground line.

In the connection structure, a countermeasure of the radiated noise is effective, since the common mode noise is transferred via the ground line of the wiring member in many cases.

APPLICATION EXAMPLE 6

In the connection structure according to Application Example 4, it is preferable that the second and third conductive lines are disposed in outermost portions in a width direction with respect to a length direction of the wiring member.

In the connection structure, since the end portions of the one side of the second conductive line and the end portion of the other side of the third conductive line are electrically opened, the high-frequency current does not flow in a portion closer to each end portion, and thus high-frequency magnetic fields formed outside the second and third conductive lines are reduced. Therefore, by disposing the second and third conductive lines respectively in one and the other of the outermost portions in the width direction with respect to the length direction of the wiring member in which the resistance of the generation of the high-frequency magnetic field is small by another conductive line of the wiring member, it is possible to maximize an effect of cancelling the high-frequency magnetic field generated in the first conductive line. The noise radiation from the wiring member can be reduced more efficiently due to this effect.

APPLICATION EXAMPLE 7

According to Application Example 7, there is provided a connection structure in which a wiring member including a plurality of conductive lines electrically connects a first device including first and second electrodes to a second device including first and second electrodes. An end portion of one side of a first conductive line of the wiring member is connected to the first electrode of the first device and an end portion of the other side of the first conductive line is connected to the first electrode of the second device. An end portion of one side of a second conductive line of the wiring member is electrically insulated from a circuit of the first device and an end portion of the other side of the second conductive line is connected to the first electrode of the second device. An end portion of one side of a fourth conductive line of the wiring member is connected to the second electrode of the first device and an end portion of the other side of the fourth conductive line is connected to the second electrode of the second device. An end portion of one side of a fifth conductive line of the wiring member is electrically insulated from the circuit of the first device and an end portion of the other side of the fifth conductive line is connected to the second electrode of the second device.

In the connection structure, when the common mode noise occurs on the side of the first device and is transferred from the first and second electrodes of the first device to the first and second electrodes of the second device along the first and fourth conductive lines of the wiring member, a high-frequency current flowing in the opposite direction (anti-parallel direction) to the direction of the high-frequency current of the common mode noise flowing in the first and fourth conductive lines flows in the second and fifth conductive lines of the wiring member since, in the second and fifth conductive lines of the wiring member, the end portions of the one sides of the second and fifth conductive lines are electrically insulated on the side of the first device, the end portion of the other side of the second conductive line is connected to the first electrode of the second device, and the end portion of the other side of the fifth conductive line is connected to the second electrode of the second device. At this time, since a relation in which radiated electromagnetic fields generated from the first and fourth conductive lines and radiated electromagnetic fields generated from the second and fifth conductive lines are cancelled is established, the radiation of the common mode noise is suppressed. Accordingly, when the wiring member includes the second and fifth conductive lines, the radiation of the common mode noise can be suppressed with high efficiency, with ease, and at low cost.

APPLICATION EXAMPLE 8

In the connection structure according to Application Example 7, it is preferable that each of the first electrode of the first device and the first electrode of the second device is a ground electrode, each of the second electrode of the first device and the second electrode of the second device is a power electrode, the first conductive line of the wiring member is a ground line, and the second conductive line of the wiring member is a power line.

In the connection structure, a countermeasure of the radiated noise is effective, since the common mode noise is transferred via the ground line and the power line of the wiring member in many cases.

APPLICATION EXAMPLE 9

In the connection structure according to Application Example 7, it is preferable that the second and fifth conductive lines are disposed in outermost portions in a width direction with respect to a length direction of the wiring member.

In the connection structure, since the end portions of the one sides of the second and the fifth conductive lines are electrically opened, the high-frequency current does not flow in a portion closer to each end portion, and thus high-frequency magnetic fields formed outside the second and fifth conductive lines are reduced. Therefore, by disposing the second and fifth conductive lines respectively in one and the other of the outermost portions in the width direction with respect to the length direction of the wiring member in which the resistance of the generation of the high-frequency magnetic field is small by another conductive line of the wiring member, it is possible to maximize an effect of cancelling the high-frequency magnetic fields generated in the first and fourth conductive lines. The noise radiation from the wiring member can be reduced more efficiently due to this effect.

APPLICATION EXAMPLE 10

In the connection structure according to Application Example 7, it is preferable that an end portion of one side of a sixth conductive line of the wiring member is connected to the first or second electrode of the first device and an end portion of the other side of the sixth conductive line is electrically insulated from a circuit of the second device.

In the connection structure, when the common mode noise occurs on the side of the second device and is transferred from the first or second electrode of the second device to the first or second electrode of the first device along the first or fourth conductive line of the wiring member, a high-frequency current flowing in the opposite direction (anti-parallel direction) to the direction of the high-frequency current of the common mode noise flowing in the first or fourth conductive line and occurring on the side of the second device flows in the sixth conductive line of the wiring member since the end portion of the one side of the sixth conductive line of the wiring member is connected to the first or second electrode of the first device and the end portion of the other side of the sixth conductive line is electrically insulated from the second device. At this time, since a relation in which radiated electromagnetic fields generated from the first or fourth conductive line and the sixth conductive line are cancelled is established, the radiation of the common mode noise occurring from the second device is suppressed. Accordingly, when the wiring member includes the sixth conductive line, the radiation of the common mode noise can be suppressed with ease and at low cost irrespective of the device from which the common mode noise occurs.

APPLICATION EXAMPLE 11

According to Application Example 11, there is provided a connection structure in which a wiring member including a plurality of conductive lines electrically connects a first device including first and second electrodes to a second device including first and second electrodes. An end portion of one side of a first conductive line of the wiring member is connected to the first electrode of the first device and an end portion of the other side of the first conductive line is connected to the first electrode of the second device. An end portion of one side of a second conductive line of the wiring member is electrically insulated from a circuit of the first device and an end portion of the other side of the second conductive line is connected to the first electrode of the second device. An end portion of one side of a fourth conductive line of the wiring member is connected to the second electrode of the first device and an end portion of the other side of the fourth conductive line is connected to the second electrode of the second device. The first and second conductive lines are electrically connected to one another via a high-frequency short-circuit capacitor near a connection portion of the first and second electrodes of the second device.

In the connection structure, when the common mode noise occurs on the side of the first device and is transferred from the first and second electrodes of the first device to the first and second electrodes of the second device along the first and fourth conductive lines of the wiring member, a high-frequency current flowing in the opposite direction (anti-parallel direction) to the direction of the high-frequency current of the common mode noise flowing in the first and fourth conductive lines flows in the second conductive line of the wiring member since, in the second conductive line of the wiring member, the end portion of the one side of the second conductive line is electrically insulated on the side of the first device and the end portion of the other side of the second conductive line is connected to the first electrode of the second device and is also connected to the second electrode of the second device via the high-frequency short-circuit capacitor. At this time, since a relation in which radiated electromagnetic fields generated from the first and fourth conductive lines, and the second conductive line are cancelled is established, the radiation of the common mode noise is suppressed. Accordingly, since the radiation level of the common mode noise is reduced, as in a cable or as describe above, and the number of conductive lines of the wiring member can be efficiently used, it is possible to provide the wiring member in which the radiation of the common mode noise can be suppressed with high efficiency, with ease, and at low cost.

APPLICATION EXAMPLE 12

In the connection structure according to Application Example 11, it is preferable that each of the first electrode of the first device and the first electrode of the second device is a ground electrode, each of the second electrode of the first device and the second electrode of the second device is a power electrode, the first conductive line of the wiring member is a ground line, and the second conductive line of the wiring member is a power line.

In the connection structure, a countermeasure of the radiated noise is effective, since the common mode noise is transferred via the ground line and the power line of the wiring member in many cases.

APPLICATION EXAMPLE 13

In the connection structure according to Application Example 11, it is preferable that the end portion of the one side of the second conductive line of the wiring member is electrically opened on a board of the first device.

In the connection structure, the wiring member efficiently reducing the radiation of the common mode noise can be configured. Further, since the wiring member can be used without performing a special process on each conductive line of the wiring member, the manufacturing cost does not increase.

APPLICATION EXAMPLE 14

In the connection structure according to Application Example 11, it is preferable that line widths or diameters of the plurality of conductive lines of the wiring member are substantially the same as one another and the conductive lines are arranged substantially at the same interval along the wiring member.

In the connection structure, a cable can be supplied at low cost, since a ready-made cable such as a flat cable can be used.

APPLICATION EXAMPLE 15

According to Application Example 15, there is provided a connection structure in which a wiring member including a plurality of wiring lines electrically connects a first device to a second device. An end portion of one side of a first conductive line arranged along the wiring member is connected to an end portion of one side of a second conductive line arranged along the wiring member via a resistor on a side of the second device. The end portion of the one side of the first conductive line connected to the resistor is connected to an end portion of the one side of a wiring line of the wiring member on the side of the second device. End portions of the other sides of the first and second conductive lines are connected to one another on a side of the first device and are electrically insulated from a circuit of the first device.

In the connection structure, when the common mode noise occurs on the side of the first device and is propagated from the first device to the second device along the wiring line of the wiring member, a high-frequency current flowing in the opposite direction (anti-parallel direction) to the direction of the high-frequency current of the common mode noise flowing in the wiring line flows in the first conductive line of the wiring member since the end portion of the one side of the wiring line is connected to the first conductive line on the side of the second device. At this time, since a relation in which radiated electromagnetic fields generated from the wiring line and the first conductive line are cancelled is established, the radiation of the common mode noise is suppressed. Further, a wiring line in which the high-frequency current of the common mode noise flows can be specified through verification or the like.

APPLICATION EXAMPLE 16

In the connection structure according to Application Example 15, it is preferable that the second conductive line is disposed on one of adjacent sides of the first conductive line and the wiring line of the wiring member is disposed on the other adjacent side of the first conductive line.

In the connection structure, since a relation in which the high-frequency current of the common mode noise having the anti-parallel relation is adjacent is established, the radiation of the noise can be suppressed more satisfactorily.

APPLICATION EXAMPLE 17

In the connection structure according to Application Example 15, it is preferable that the wiring line of the wiring member connects a ground electrode of the first device to a ground electrode of the second device.

In the connection structure, a countermeasure of the radiated noise is effective, since the common mode noise is transferred via the ground line of the wiring member in many cases.

APPLICATION EXAMPLE 18

In the connection structure according to Application Example 15, it is preferable that the first and second conductive lines are a pair of conductive lines and are disposed in one of outermost portions in a width direction with respect to a length direction of the wiring member.

In the connection structure, since the end portion of the one side of the second conductive line becomes electrically high impedance, the high-frequency current does not flow in a portion closer to the end portion, and thus the high-frequency magnetic field formed outside the second conductive line is reduced. Therefore, by disposing the second conductive line in one of the outermost portions in the width direction with respect to the length direction of the wiring member in which the resistance of the generation of the high-frequency magnetic field is small by another conductive line of the wiring member, it is possible to maximize an effect of cancelling the high-frequency magnetic field generated in the first conductive line. The noise radiation from the wiring member can be reduced more efficiently due to this effect.

APPLICATION EXAMPLE 19

In the connection structure according to Application Example 15, it is preferable that a resistive value of the resistor is set in accordance with a frequency band of the radiated noise.

In the connection structure, since the frequency of the radiated noise for which a countermeasure is necessary can be adjusted, a countermeasure effect of a necessary noise band can be obtained.

APPLICATION EXAMPLE 20

According to Application Example 20, there is provided a connection structure in which a wiring member including a plurality of wiring lines electrically connects a first device to a second device. End portions of one sides of first and second conductive lines arranged along the wiring member are connected to one another via a first resistor on a side of the second device. The end portion of one side of the first conductive line connected to the first resistor is connected to an end portion of one side of a first wiring line of the wiring member on the side of the second device. End portions of the other sides of the first and second conductive lines are connected to one another on a side of the first device and are electrically insulated from a circuit of the first device. End portions of one sides of third and fourth conductive lines arranged along the wiring member are connected to one another via a second resistor on the side of the first device. The end portion of the one side of the third conductive line connected to the second resistor is connected to an end portion of one side of a second wiring line of the wiring member on the side of the second device. End portions of the other sides of the third and fourth conductive lines are connected to one another on the side of the second device and are electrically insulated from a circuit of the second device.

In the connection structure, when the common mode noise occurs on the side of the first device and is propagated from the first device to the second device along the wiring line of the wiring member, a high-frequency current flowing in the opposite direction (anti-parallel direction) to the direction of the high-frequency current of the common mode noise flowing in the first wiring line flows in the first conductive line of the wiring member since the end portion of the one side of the first wiring line is connected to the first conductive line on the side of the second device. At this time, since a relation in which radiated electromagnetic fields generated from the wiring line and the first conductive line are cancelled is established, the radiation of the common mode noise is suppressed.

Further, when the common mode noise occurs on the side of the second device and is propagated from the second device to the first device along the second wiring line of the wiring member, a high-frequency current flowing in the opposite direction (anti-parallel direction) to the direction of the high-frequency current of the common mode noise flowing in the second wiring line flows in the third conductive line of the wiring member since the second wiring line is connected to the third conductive line on the side of the first device. At this time, since a relation in which radiated electromagnetic fields generated from the wiring line and the first conductive line are cancelled is established, the radiation of the common mode noise is suppressed. Accordingly, the radiated noise caused due to the common mode noise propagated to both sides of the wiring member can be suppressed.

APPLICATION EXAMPLE 21

In the connection structure according to Application Example 21, it is preferable that the second conductive line is disposed on one of adjacent sides of the first conductive line, the first wiring line of the wiring member is disposed in the other adjacent side of the first conductive line, the fourth conductive line is disposed on one of adjacent sides of the third conductive line, and the second wiring line of the wiring member is disposed on the other adjacent side of the third conductive line.

In the connection structure, since a relation in which the high-frequency current of the common mode noise having the anti-parallel relation is adjacent is established, the radiation of the noise can be suppressed more satisfactorily.

APPLICATION EXAMPLE 22

In the connection structure according to Application Example 21, it is preferable that the first wiring line of the wiring member or the second wiring line of the wiring member is a wiring line connecting a ground electrode of the first device to a ground electrode of the second device.

In the connection structure, a countermeasure of the radiated noise is effective, since the common mode noise is transferred via the ground line of the wiring member in many cases.

APPLICATION EXAMPLE 23

In the connection structure according to Application Example 21, it is preferable that the first wiring line of the wiring member and the second wiring line of the wiring member is the same wiring line.

In the connection structure, the number of wiring lines of the wiring member can be reduced.

When the first and second devices are connected by the wiring member to realize the above-described connection structure, the radiation of the common mode noise can be suppressed with ease and at low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
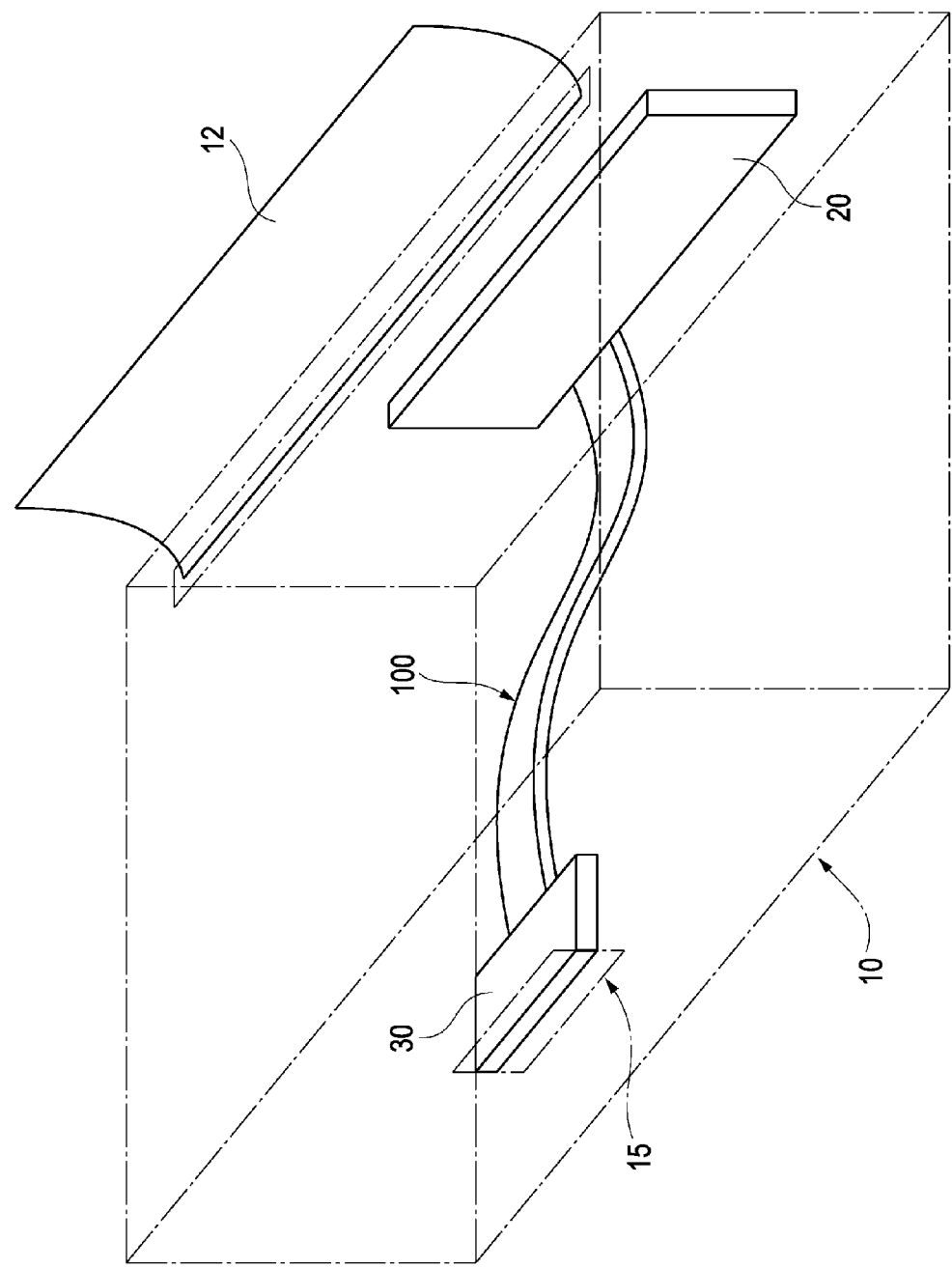
FIG. 1 is a diagram illustrating the outer appearance of a printer which is a printing apparatus.

Hereinafter, description will be made with reference to the drawings.
First Embodiment FIG. 1 is a diagram illustrating the outer appearance of a printer 10 which is a printing apparatus. The printer 10 is a so-called standalone type printer. A memory card insertion section 15 is formed on a side surface of the printer 10. When a user inserts a memory card (not shown) into the memory card insertion section 15 and operates an operation unit (not shown), the printer 10 reads image data written in the memory card, performs image processing on image data instructed to be printed by the user in the read image data, transfers the processed image data on a sheet 12, and discharges the sheet 12.

Inside the printer 10, a main board 20 on which an electronic circuit controlling main functions including a printing function is mounted is disposed away from a daughter board 30 on which an electronic circuit reading a memory card is mounted. In a first embodiment, the main board 20 serves as a first device and the daughter board 30 serves as a second device. The main board 20 and the daughter board 30 are electrically connected by a flat cable 100 (wiring member) such as an FFC. Supply of power, data communication, and exchange of control signal are performed between the main board 20 and the daughter board 30 via a plurality of conductive lines of the flat cable 100.

In the first embodiment, a bus controller (not shown) of a data bus configured by the flat cable 100 is mounted in the main board 20 and the daughter board 30. The bus controller controls a protocol of data transmitted and received between the main board 20 and the daughter board 30.

Figure 2:
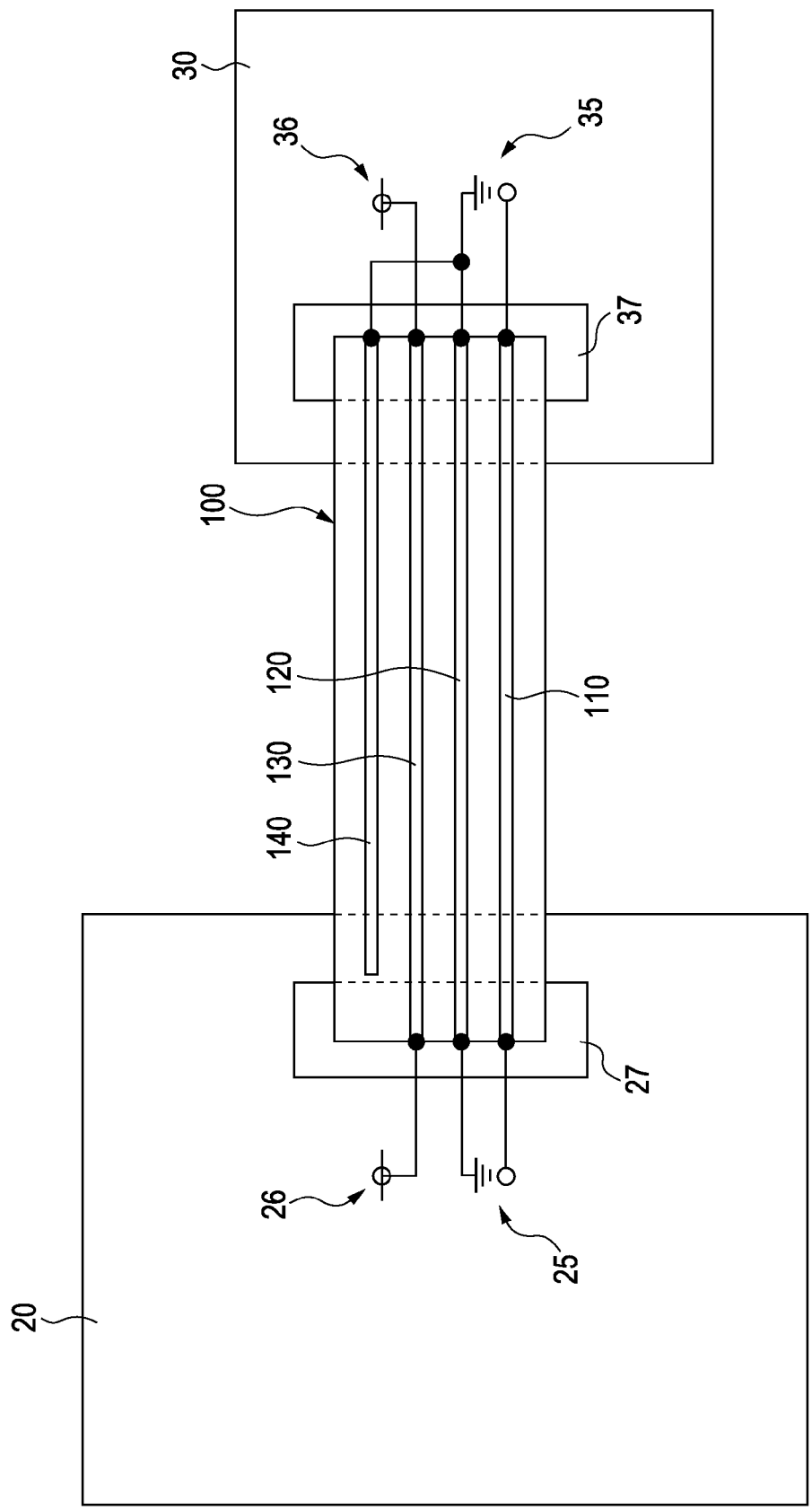
FIG. 2 is a diagram illustrating the structure of a flat cable according to a first embodiment.

FIG. 2 is a diagram illustrating the structure of the flat cable 100. The flat cable 100 includes a signal line 110, a first GND line 120, a power line 130, and a second GND line 140 as conductive lines. The widths of the lines are substantially the same as one another. The lines are arranged along the flat cable 100 substantially at the same interval and are fixed by a connector 27 of the main board 20 and a connector 37 of the daughter board 30 to be electrically connected to one another.

The first GND line 120 which is a first conductive line connects a GND electrode (ground electrode) 25 of the main board 20 to a GND electrode 35 of the daughter board 30. Further, one side of the second GND line 140 which is a second conductive line connected to the GND electrode 35 of the daughter board 30. The other side of the second GND line 140 reaches the vicinity of the main board 20, but is not connected to the GND electrode 25 of the main board 20 to be electrically opened. That is, the second GND line 140 is electrically insulated from the circuit of the main board 20. In FIG. 2, the end portion of the other side the second GND line 140 does not reach the connector 27 of the main board 20. However, the end portion of the other side of the second GND line 140 may be mechanically fixed to the connector 27, as long as the end portion of the other side of the second GND line 140 is not connected to the circuit of the main board 20.

The power line 130 connects a power terminal 26 of the main board 20 to a power terminal 36 of the daughter board 30 and supplies power from the main board 20 to the daughter board 30.

It is experimentally known that a line of which the end portion of one side is insulated, as in the second GND line 140, is preferably disposed in any one of the outermost end portions in a direction perpendicular to the length direction of the flat cable 100. This is because an operation of a radiated electromagnetic field formed by the second GND line 140 functions more effectively. Qualitatively, the end portion of the one side of the second GND line 140 is electrically opened. Therefore, a high-frequency current does not flow in a portion closer to the end portion, and thus the high-frequency magnetic field formed outside the second GND line 140 is accordingly reduced. Accordingly, by disposing the second GND line 140 in the outermost portion in the width direction with respect to the length direction of the flat cable 100 in which the resistance of the generation of the high-frequency magnetic field is small by another conductive line of the flat cable 100, it is possible to maximize an effect of cancelling the high-frequency magnetic fields generated in the first GND line 120 and the power line 130 to be described later.

In the first embodiment, a common mode noise source is assumed to be present in the main board 20 and common mode noise is assumed to be transferred from the main board 20 to the daughter board 30.

Accordingly, when the common mode noise is transferred from the main board 20 to the daughter board 30, the high-frequency current of the common mode noise with the same phase flows along each of the signal line 110 or the first GND line 120 and the power line 130. On the other hand, since the high-frequency current of the common mode noise from the first GND line 120 flows in the second GND line 140 from the daughter board 30 to the main board 20 via the GND electrode 35 on the daughter board 30, a relation in which the high-frequency current flows in mutually opposite directions in the flat cable 100 is established between the second GND line 140, and the first GND line 120, the power line 130, and the signal line 110. As a result, a relation is established in which the radiated electromagnetic fields generated from the second GND line 140 and the signal line 110 or, particularly, the first GND line 120 and the power line 130 are cancelled. Therefore, the radiation level is reduced compared to the radiation level of the common mode noise when the second GND line 140 is not provided.

In particular, when the length of the flat cable 100 approximates a quarter or half of the equivalent wavelength of the common mode noise, the noise may be radiated to a space by the wavelength resonance of the common mode noise depending on the length of the flat cable 100 in some cases. However, since the second GND line 140 has the effect in which the high-frequency current flows in the opposite direction to the conductive direction of the common mode noise, as described above, the radiated electromagnetic fields can be cancelled. Accordingly, the radiated electromagnetic field radiated from the flat cable 100 can be suppressed.

The invention is not limited to the specific structure according to the first embodiment, but the signal line 110 may include a plurality of lines. That is, the signal line 110 may include a line or the like through which a clock signal serving as a reference signal for digital processing is transmitted. Further, a differential line or the like including two lines may be included. Further, the GND line may include a plurality of lines. That is, the first GND line 120 and the second GND line 140 may each include a plurality of lines.

Next, the effect of the first embodiment examined using an electromagnetic field simulator will be described. As a simulation model, three lines formed of a copper foil with a thickness of 35 micrometers and having a width of 0.7 mm and a length of 150 mm are disposed parallel at an interval of 0.3 mm in the flat cable 100. That is, the lines are set as the power line 130, the first GND line 120, and the second GND line 140, a high-frequency short-circuit capacitor connects both front ends portions of the power line 130 and the first GND line 120 to one another, and high-frequency potentials between the lines are made to be same as one another. Further, in regard to a signal source which causes noise, one pole of the signal source is connected to the power line 130 and the other pole of the signal source is connected to a ground wall 50 of a simulation space set to be vertical to the flat cable 100.

Figure 3:
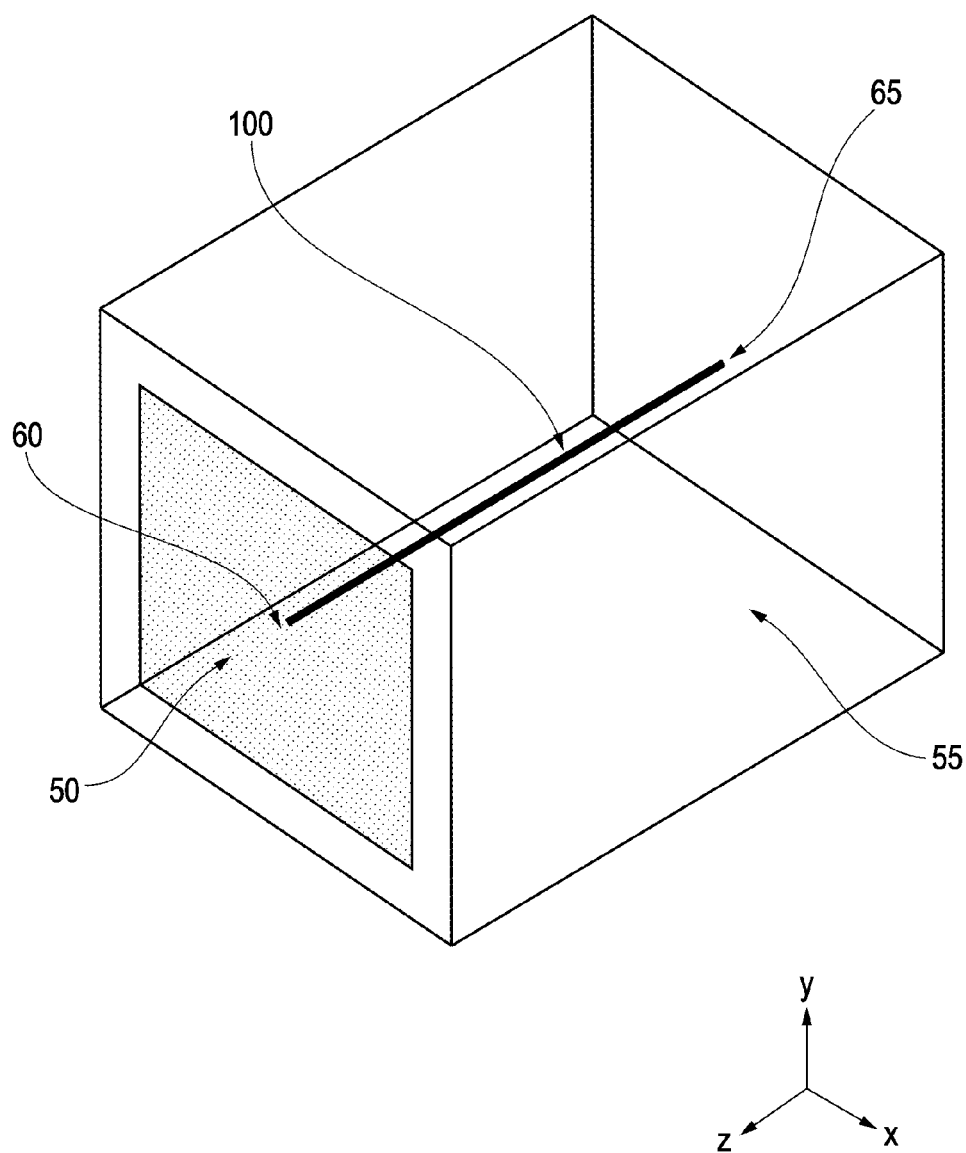
FIG. 3 is a diagram illustrating a simulation model according to the first embodiment.

Thus, high-frequency signals (common mode signals) with the same phase are excited to the power line 130 and the first GND line 120 artificially. In the second GND line 140, the front end portion on the side of the signal source is opened and the opposite front end portion is short-circuited from the first GND line 120. To simplify the simulation model, the signal line 110 and resin or the like added as an outer cover is not shown. In the simulation space, as shown in FIG. 3, the wall surfaces other than the ground wall 50 are configured as electric field absorption walls 55. In this model, in the flat cable 100, the side of the signal source 60 is set as the side of the main board 20 and the opposite side is set as the side of the daughter board 30.

Initially, a proper load resistance has to be set in the flat cable 100 on the side of the daughter board 30. However, in this verification, the side of the flat cable 100 on the side of the daughter board 30 is set to be in an open state in which the level of an electromagnetic field radiated from the flat cable 100 is the worst. A problem with the radiation of an electromagnetic field does not occur in the original flat cable 100 under the basically matched load condition. Further, when resistance is present to some extent, an electromagnetic field is radiated while the energy of noise is lost, basically even in the mismatch state. Accordingly, the reason for setting the open state is that the worst condition is the open state in which the loss of the energy is assumed to be the smallest.

Figure 4:
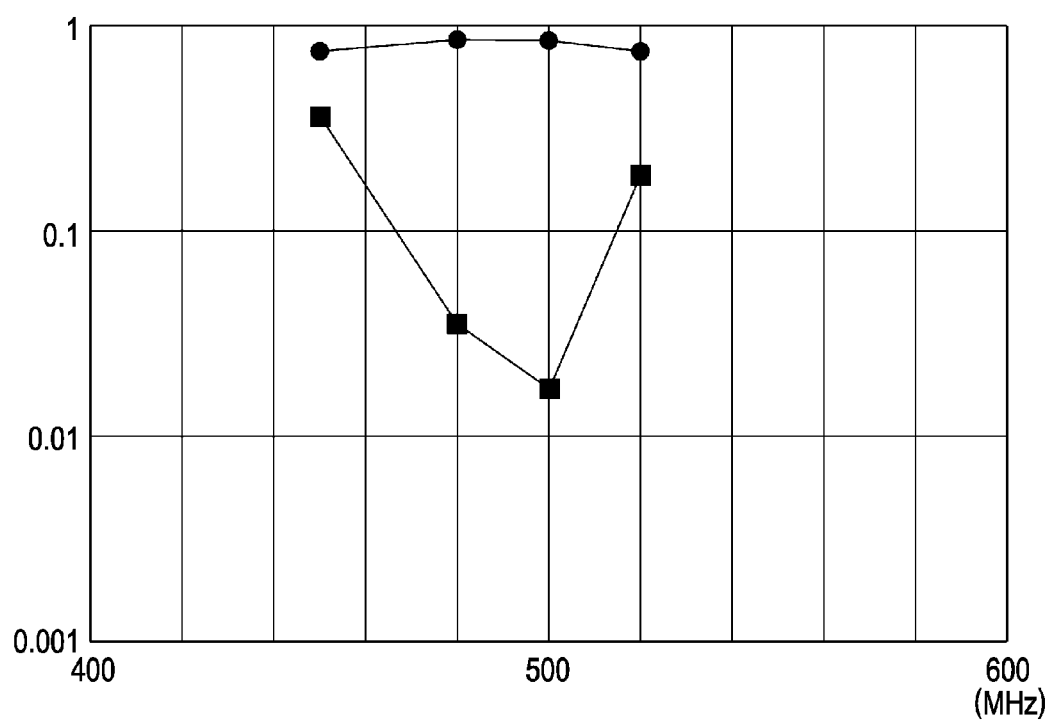
FIG. 4 is a diagram illustrating a radiation efficiency of a band near a frequency of 500 MHz according to the first embodiment.

As shown in FIG. 4, the situations of the radiated electromagnetic field in the simulation are as follows near 500 MHz which is approximately a quarter of the wavelength of the signal source.

1. When the second GND line 140 of the flat cable 100 is not provided, an electromagnetic wave having a main polarized wave in the length direction is efficiently radiated to a space perpendicular to the length direction of the flat cable 100.

2. When the second GND line 140 according to the first embodiment is provided, the radiation efficiency of the radiated electromagnetic field of the flat cable 100 is reduced up to about 2.4% in the 500 MHz band, compared to Situation 1.

As understood from the above-mentioned examination, according to the first embodiment, it is possible to reduce the level of the radiated electromagnetic field of the common mode noise flowing from the main board 20 to the daughter board 30 via the flat cable 100.

Second Embodiment

Figure 5:
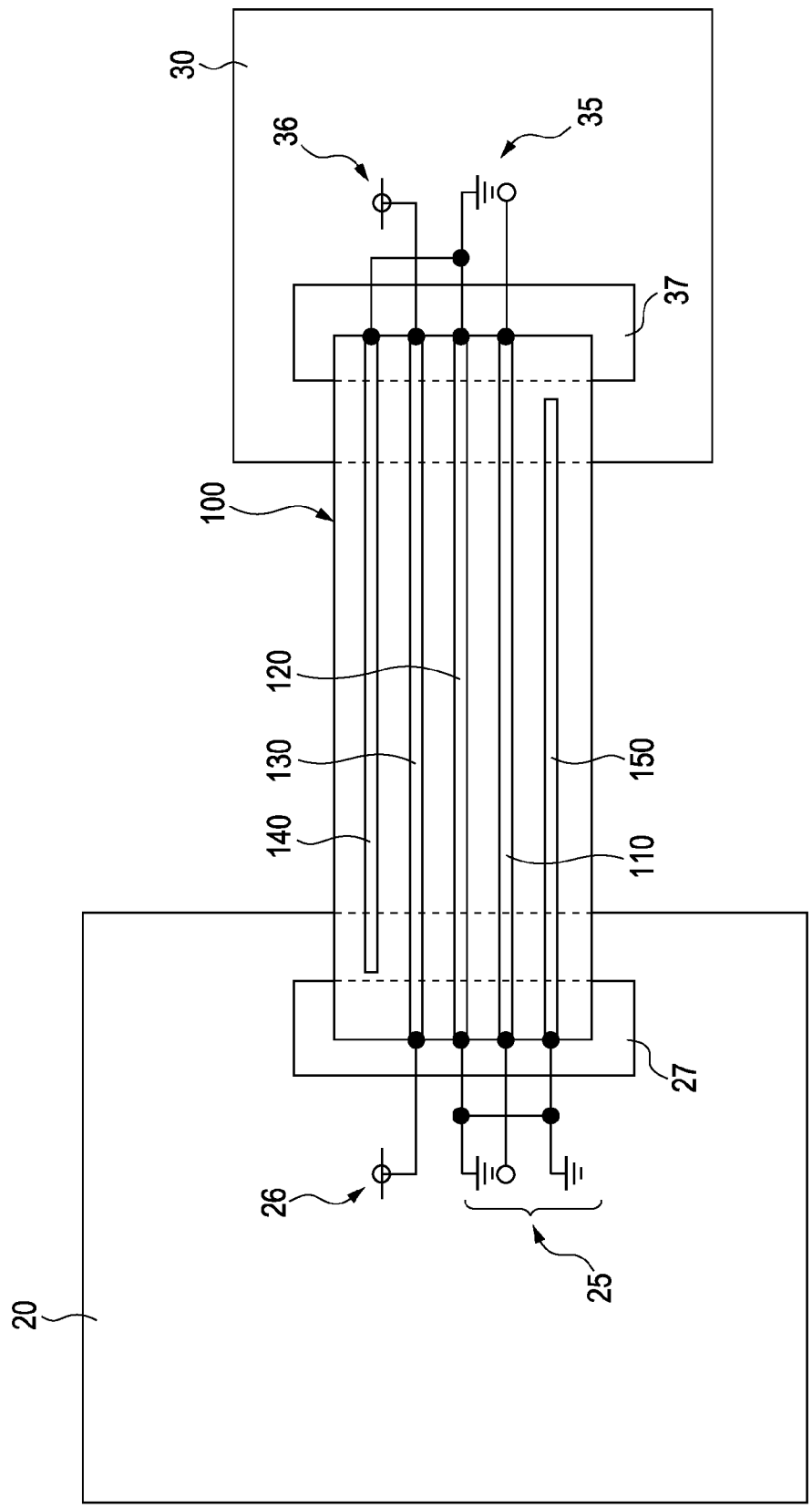
FIG. 5 is a diagram illustrating the structure of a flat cable according to a second embodiment.

Next, the structure of a flat cable 100 according to a second embodiment of the invention will be described with reference to FIG. 5. In the following description, the same reference numerals are given to the same portions as those described above, and the description thereof will not be repeated.

In the second embodiment, the flat cable 100 includes the signal line 110, the first GND line 120, the power line 130, and the second GND line 140 thereon. In the second embodiment, the flat cable 100 further includes a third GND line 150. The widths of the lines are substantially the same as one another. The lines are arranged along the flat cable 100 substantially at the same interval and are fixed by a connector 27 of the main board 20 and a connector 37 of the daughter board 30 to be electrically connected to one another.

One side of the third GND line 150 which is a third conductive line is connected to the GND electrode 25 of the main board 20. The other side of the third GND line 150 reaches the vicinity of the daughter board 30 and is not connected to the GND electrode 35 of the daughter board 30. That is, the third GND line 150 is electrically insulated from the circuit of the daughter board 30. In FIG. 5, the end portion of the other side of the third GND line 150 does not reach the connector 37 of the daughter board 30. However, the end portion of the other side of the third GND line 150 may be mechanically fixed to the connector 37, as long as the end portion of the other side of the third GND line 150 is not connected to the circuit of the daughter board 30.

In the second embodiment, a common mode noise source is assumed to be present in both the main board 20 and the daughter board 30. With such a structure, common mode noise is transferred between the main board 20 and the daughter board 30 irrespective of the transmission direction of a signal.

Accordingly, when the common mode noise is transferred along each conductive direction between the main board 20 and the daughter board 30, the high-frequency current of the common mode noise with the same phase flows in each of the signal line 110 or the first GND line 120 and the power line 130. However, the high-frequency current of the common mode noise flowing in an opposite direction to the direction of the high-frequency current of the transferred common mode noise may flow in the second GND line 140 and the third GND line 150.

As a result, when the common mode noise is transferred from the main board 20 to the daughter board 30, the high-frequency current of the common mode noise flowing in the second GND line 140 has an anti-parallel relation with the high-frequency current of the common mode noise flowing in the signal line 110 or the first GND line 120 and the power line 130 of the flat cable 100. Further, when the common mode noise is transferred from the daughter board 30 to the main board 20, the high-frequency current of the common mode noise flowing in the third GND line 150 has an anti-parallel relation with the high-frequency current of the common mode noise flowing in the signal line 110 or the first GND line 120 and the power line 130 of the flat cable 100. Since the radiated electromagnetic fields generated in the lines are cancelled one another according to the anti-parallel relations of the high-frequency current of the common mode noise, the entire radiated electromagnetic field can be suppressed.

The invention is not limited to the specific structure according to the second embodiment, but the signal line 110 may include a plurality of lines. That is, the signal line 110 may include a line or the like through which a clock signal serving as a reference signal of digital processing is transmitted. Further, a differential line or the like including two conductive lines may be included. Further, the GND line may include a plurality of lines. That is, the first GND line 120, the second GND line 140, and the third GND line 150 may each include a plurality of lines.

In the second embodiment, it is possible to reduce the level of the radiated electromagnetic field of the common mode noise occurring from the main board 20 and the daughter board 30.

Third Embodiment

Figure 6:
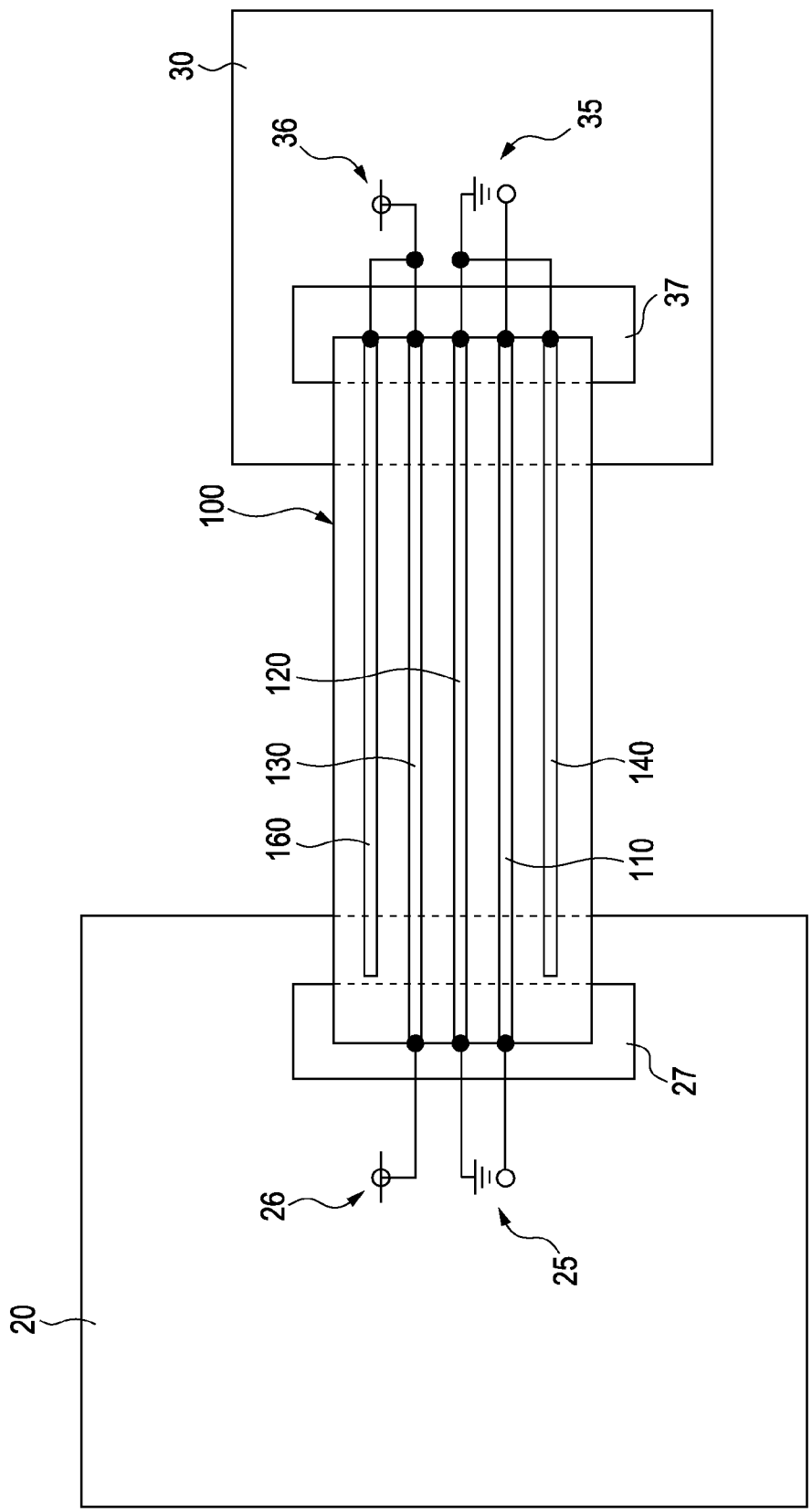
FIG. 6 is a diagram illustrating the structure of a flat cable according to a third embodiment.

Next, the structure of a flat cable 100 according to a third embodiment of the invention will be described with reference to FIG. 6. In the third embodiment, the flat cable 100 includes the signal line 110, the first GND line 120, the power line 130, and the second GND line 140 thereon. In the third embodiment, the flat cable 100 further includes a second power line 160. The widths of the lines are substantially the same as one another. The lines are arranged along the flat cable 100 substantially at the same interval and are fixed by a connector 27 of the main board 20 and a connector 37 of the daughter board 30 to be electrically connected to one another.

The end portion of one side of the second power line 160 is electrically connected to the power terminal 36 of the daughter board 30. The end portion of the other side of the second power line 160 reaches the vicinity of the main board 20 and is electrically insulated from the circuit of the main board 20. In the third embodiment, the power line 130 serves as a fourth conductive line and the second power line 160 serves as a fifth conductive line. In FIG. 6, the end portion of the other side of the second power line 160 does not reach the connector 27 of the main board 20. However, the end portion of the other side of the second power line 160 may be mechanically fixed to the connector 27, as long as the end portion of the other side of the second power line 160 is not connected to the circuit of the main board 20.

With such a structure, in regard to the common mode noise transferred from the main board 20 to the daughter board 30, the high-frequency current component of the common mode noise flowing in the opposite direction can be added by the second power line 160 to not only the high-frequency current of the common mode noise flowing in the opposite direction in the above-described second GND line 140 but also the high-frequency current component of the common mode noise flowing along the power line 130. On the other hand, compared to the first embodiment, a relation in which an anti-parallel high-frequency current flows is added. Therefore, since the electromagnetic field radiated from each line can be cancelled more satisfactorily, the electromagnetic field radiated from the flat cable 100 can be suppressed.

The invention is not limited to the specific structure according to the third embodiment, but the signal line 110 may include a plurality of lines. That is, the signal line 110 may include a line or the like through which a clock signal serving as a reference signal of digital processing is transmitted. Further, a differential line or the like including two lines may be included. Further, the GND line and the power line may include a plurality of lines. That is, the first GND line 120, the second GND line 140, the power line 130, and the second power line 160 may each include a plurality of lines.

Figure 7:
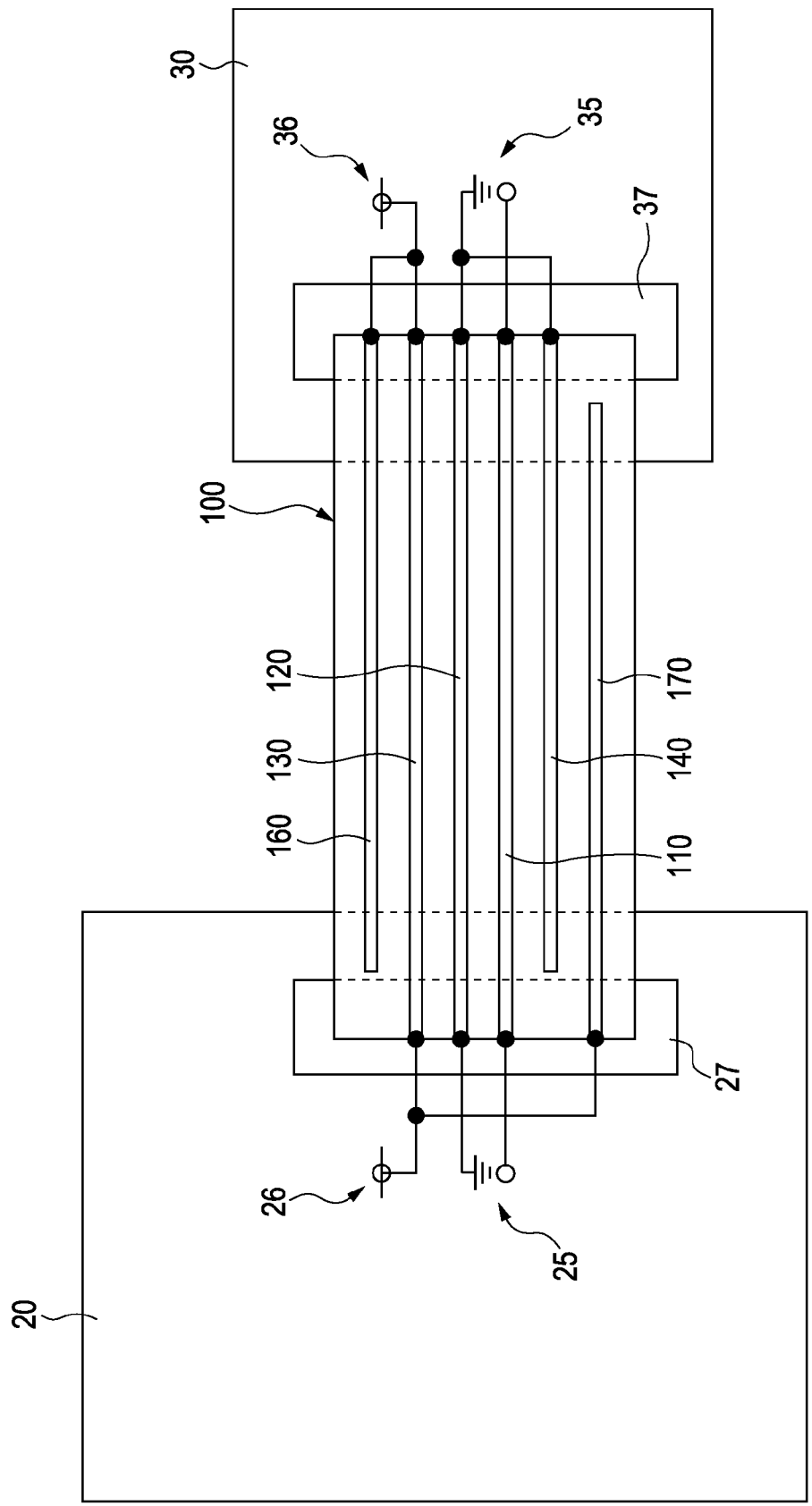
FIG. 7 is a diagram illustrating the structure of another flat cable according to the third embodiment.

In the third embodiment, when the common mode noise occurs from both the main board 20 and the daughter board 30, a third power line 170 may be provided as a sixth conductive line, as shown in FIG. 7 which shows the structure of the flat cable 100. The widths of the lines are substantially the same as one another. The lines are arranged along the flat cable 100 substantially at the same interval and are fixed by a connector 27 of the main board 20 and a connector 37 of the daughter board 30 to be electrically connected to one another. In this case, the end portion of one side of the third power line 170 is connected to the power terminal 26 of the main board 20. The end portion of the other side of the third power line 170 reaches the vicinity of the daughter board 30 and is not electrically insulated from the circuit of the daughter board 30. In FIG. 7, the end portion of the other side of the third power line 170 does not reach the connector 37 of the daughter board 30. However, the end portion of the other side of the third power line 170 may be mechanically fixed to the connector 37, as long as the end portion of the other side of the third power line 170 is not connected to the circuit of the daughter board 30.

Thus, when the common mode noise is transferred from the daughter board 30 to the main board 20, the high-frequency current of the common mode noise flows along the signal line 110 or the first GND line 120 and the first power line 130 of the flat cable 100. The high-frequency current of the anti-parallel common mode noise flows in the third power line 170. Thus, since the electromagnetic field radiated from each line can be cancelled more satisfactorily, the radiation level of the common mode noise from the flat cable 100 can be reduced.

The invention is not limited to this specific structure. The end portion of one side of the sixth conductive line may be connected to the GND electrode of the main board 20. Alternatively, a plurality of sixth conductive lines may be set to connect the end portion of one side of the GND electrode and the power terminal of the main board 20.

Next, an effect of the third embodiment examined using an electromagnetic field simulator, as in the first embodiment, will be described. Further, a simulation model which is basically the same as that of the first embodiment is used.

In the third embodiment, four lines formed of a copper foil with a thickness of 35 micrometers and having a width of 0.7 mm and a length of 150 mm are disposed parallel at an interval of 0.3 mm in the flat cable 100. First, two lines, that is, the first GND line 120 and the power line 130 are disposed in the middle, the second GND line 140 is disposed aside from the first GND line 120, and the second power line 160 is disposed aside from the power line 130. Further, to simplify the simulation model, the signal line 110 and resin or the like added as an outer cover is not shown.

A high-frequency short-circuit capacitor connects the front end portions of the first power line 130 and the first GND line 120 to one another, and thus high-frequency potentials between these lines are made to be same as one another. Further, in regard to a signal source which causes noise, one pole of the signal source is connected to the first power line 130 and the other pole of the signal source is connected to a ground wall 50 of a simulation space set to be vertical to the flat cable 100. Thus, high-frequency signals (common mode signals) with the same phase are excited to the first power line 130 and the first GND line 120 in a pseudo-way. In the second GND line 140, the front end portion on the side of the signal source is opened and the opposite front end portion is short-circuited from the first GND line 120. Further, in the second power line 160, the front end portion on the side of the signal source is opened and the opposite front end portion is short-circuited from the first power line 130.

In the simulation space, as shown in FIG. 3, the wall surfaces other than the ground wall 50 are configured as electric field absorption walls 55. In this model, in the flat cable 100, the side of the signal source is set as the side of the main board 20 and the opposite side is set as the side of the daughter board 30.

Figure 8:
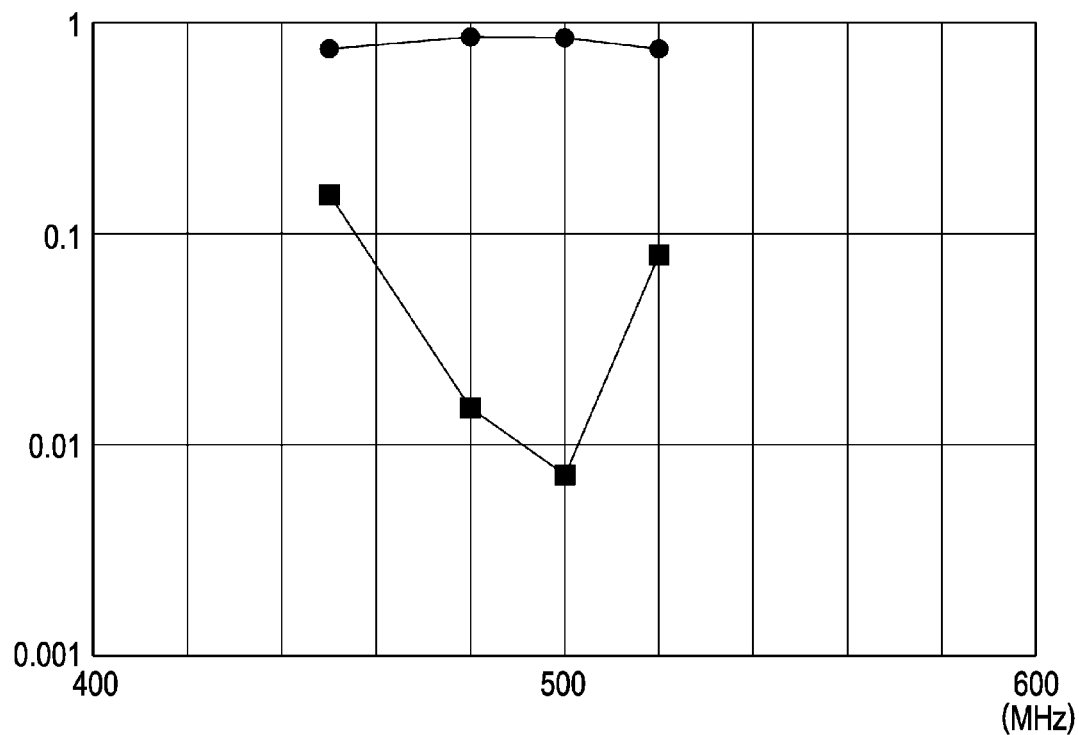
FIG. 8 is a diagram illustrating a radiation efficiency of a band near a frequency of 500 MHz according to the third embodiment.

FIG. 8 shows the result of the radiation efficiency in a 500 MHz band when the verification is performed using the above-mentioned electromagnetic field simulator.

1. When the second GND line 140 and the second power line 160 of the flat cable 100 are not provided near 500 MHz, which is about a quarter of the wavelength of the signal source, in a radiated electromagnetic field of the simulation, an electromagnetic wave having a main polarized wave in the length direction is efficiently radiated to a space perpendicular to the length direction of the flat cable 100.

2. When the second GND line 140 and the second power line 160 according to the third embodiment are provided, the radiation efficiency of the radiated electromagnetic field of the flat cable 100 is reduced up to about 1% in the 500 MHz band, compared to Situation 1.

As understood from the above-mentioned examination, according to the third embodiment, it is possible to reduce the level of the radiated electromagnetic field of the common mode noise caused from the main board 20 or the daughter board 30.

Fourth Embodiment

Figure 9:
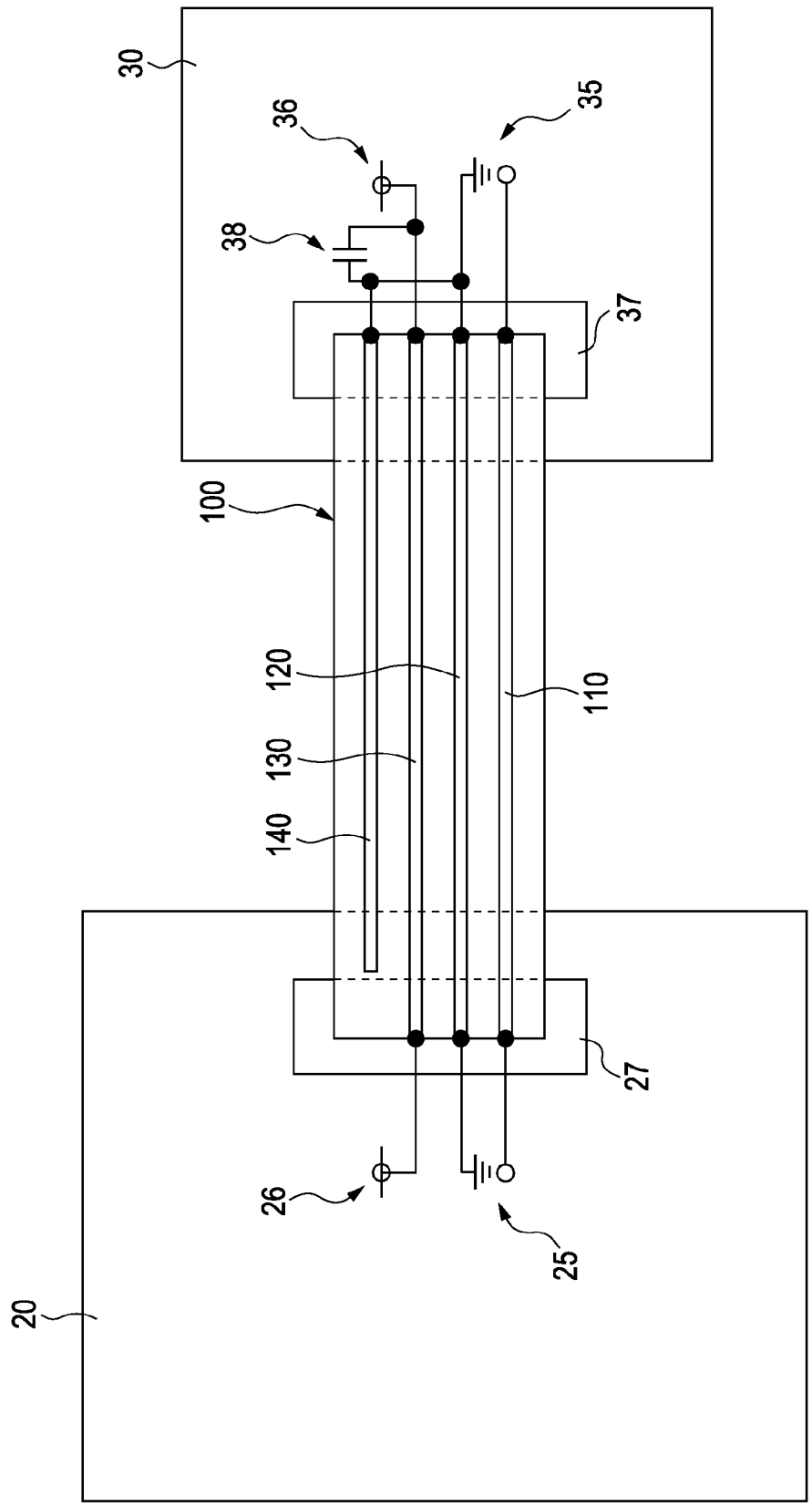
FIG. 9 is a diagram illustrating the structure of a flat cable according to a fourth embodiment.

Next, the structure of a flat cable 100 according to a fourth embodiment of the invention will be described with reference to FIG. 9. In the fourth embodiment, the flat cable 100 includes a signal line 110, a first GND line 120, a power line 130, and a second GND line 140 thereon. A GND electrode 35 of the daughter board 30 is connected to the end portion of one side of the power line 130 via a high-frequency short-circuit capacitor 38. The widths of the lines are substantially the same as one another. The lines are arranged along the flat cable 100 substantially at the same interval and are fixed by a connector 27 of the main board 20 and a connector 37 of the daughter board 30 to be electrically connected to one another.

In the fourth embodiment, in regard to the direction of the high-frequency current of the common mode noise flowing from the main board 20 to the daughter board 30, not only the high-frequency current of the opposite direction flowing in the second GND line 140 but also the component of the high-frequency current of the common mode noise flowing from the main board 20 to the daughter board 30 along the power line 130 can flow into the second GND line 140. Accordingly, the high-frequency current can be made to flow in an anti-parallel direction more efficiently. As the feature of this structure, the number of lines of the flat cable 100 can be reduced.

The invention is not limited to the specific structure according to the fourth embodiment, but the signal line 110 may include a plurality of lines. That is, the signal line 110 may include a line or the like through which a clock signal serving as a reference signal for digital processing is transmitted. Further, a differential line or the like including two conductive lines may be included. Further, the GND line may include a plurality of lines. That is, the first GND line 120 and the second GND line 140 may each include a plurality of lines.

In the fourth embodiment, the structure is realized as a countermeasure of the propagation of the common mode noise from the main board 20 to the daughter board 30. As described in the second embodiment, however, the end portion of one side of a third GND line 150 may be connected to the GND electrode of the main board 20 and the end portion of the other side of the third GND line 150 may be insulated from the daughter board 30.

In the fourth embodiment, the number of lines of the flat cable 100 can be reduced in addition to the effect described in the second embodiment.

As described in the fourth embodiment, the electrically opened end portions of the second GND line 140, the second power line 160, and the third power line 170 may be opened in the flat cable 100 in the vicinity of a board of an apparatus faced by the front end portions.

When the flat cable 100 is inserted into a connector installed for the flat cable 100 installed in the board of the apparatus for use, the end portions of the second GND line 140, the second power line 160, and the third power line 170 may come into contact with electrode terminals of the connector and the electrode terminals of the connector may be electrically insulated from a circuit pattern formed in the board of the apparatus, so that an electrically open state can be realized.

In the problem of the radiated electromagnetic field caused from the wiring member, the size of the board of the connected apparatus in addition to the length of the wiring member may also cause a problem. In this case, (1) any pattern electrically insulated from the circuit pattern formed in the apparatus may be formed in the board of the apparatus, the pattern may be connected via the connector for the flat cable 100, and the end portion of the second GND line 140, the third GND line 150, the second power line 160, or the third power line 170 may be electrically opened.

In the same problem, (2) a power line pattern and a GND line pattern formed on the board of the apparatus may be extracted in a line shape from any portion of the circuit pattern of the apparatus and may be connected to the first GND line 120 and the second GND line 140, the third GND line 150, the first power line 130, the second power line 160, or the third power line 170 via the connector for the flat cable 100. It is possible to adjust and apply the frequency characteristics of the noise radiation suppression of the wiring member according to this embodiment at the frequency band of the common mode noise for which the countermeasure is necessary according to (1) and (2) mentioned above.

Fifth Embodiment

Figure 10:
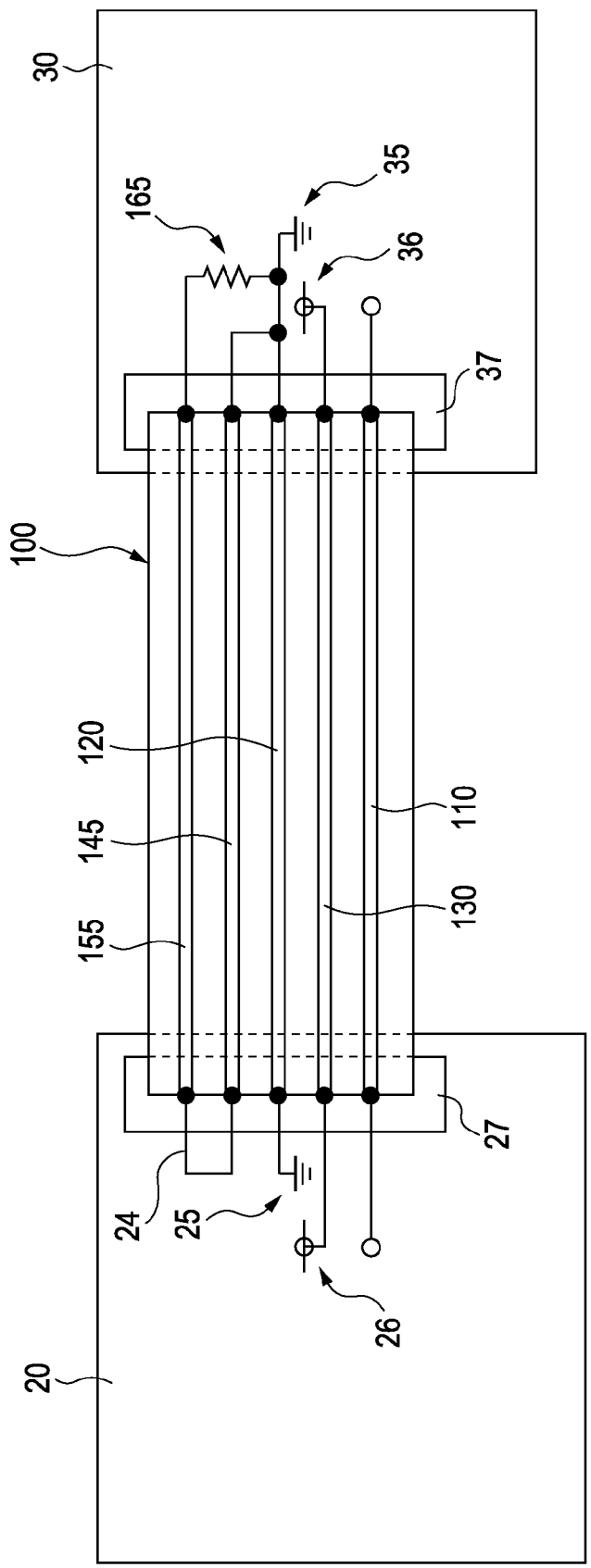
FIG. 10 is a diagram illustrating the structure of a flat cable according to a fifth embodiment.

Next, the structure of a flat cable 100 according to a fifth embodiment of the invention will be described with reference to FIG. 10. In the fifth embodiment, the flat cable 100 includes a signal line 110, a first GND line 120, and a power line 130 as wiring lines. The flat cable 100 further includes a first conductive line 145 and a second conductive line 155 in addition to the wiring lines. The widths of the lines are substantially the same as one another. The lines are arranged along the flat cable 100 substantially at the same interval and are fixed by a connector 27 of the main board 20 and a connector 37 of the daughter board 30 to be electrically connected to one another.

That is, the first GND line 120 connects a GND electrode (ground electrode) 25 of the main board 20 to a GND electrode 35 of the daughter board 30, the power line 130 connects a power terminal 26 of the main board 20 to a power terminal 36 of the daughter board 30, and the signal line 110 connects a signal terminal of the main board 20 to a signal terminal of the daughter board 30. A plurality of lines of each wiring line may be prepared to execute functions necessary in the main board 20 and the daughter board 30.

The end portion of one side of the first conductive line 145 is connected to the end portion of one side of the second conductive line 155 via a resistor 165 on the daughter board 30. The end portion of the one side of the first conductive line 145 is also electrically connected the GND electrode 35 of the daughter board 30 or the end portion of the first GND line 120 on the side of the daughter board 30. Further, the end portion of the other side of the first conductive line 145 is electrically connected to the end portion of the other side of the second conductive line 155 on the side of the main board 20. A connection section 24 is insulated directly and electrically from a circuit of the main board 20. Here, the term "directly" means that the connection section 24 is not explicitly connected to another circuit on the main board 20.

In the fifth embodiment, a common mode noise source is assumed to be present in the main board 20 and common mode noise is assumed to be transferred from the main board 20 to the daughter board 30.

When the common mode noise is transferred from the main board 20 to the daughter board 30, the high-frequency current of the common mode noise with the same phase flows along each of the signal line 110 or the first GND line 120 and the power line 130. At this time, when the length of the flat cable 100 is substantially the same as a quarter of the equivalent wavelength of the common mode noise to be targeted, an amplitude distribution of the high-frequency current of the common mode noise is noticeable in the wiring lines of the flat cable.

That is, when the length of the flat cable 100 is approximately a quarter of the equivalent wavelength of the common mode noise from a phase component relation of a component of the high-frequency current of the common mode noise from the connector 27 to the connector 37 and a component of the high-frequency current reflected from the connector 37 and a relation of the length of the flat cable 100, an amplitude change of the high-frequency current of the common mode noise is the maximum on the side of the connector 37 and the amplitude change of the high-frequency current of the common mode noise is the minimum on the side of the connector 27. The amplitude change is a difference between the maximum and the minimum of the absolute value of the amplitude caused due to a phase change of the high-frequency current. In regard to the behavior of the high-frequency current of the common mode noise, the radiation of the noise is suppressed by the following operation in the flat cable 100 according to the fifth embodiment.

First, in a phase in which the current amplitude of the common mode noise is the maximum (absolute value) on the side of the connector 37, the first GND line 120 and the first conductive line 145 are short-circuited on the side of the connector 37. Therefore, since the high-frequency current of the common mode noise can flow in an anti-parallel relation, a relation in which the radiated electromagnetic fields generated from the first GND line 120 and the first conductive line 145 are cancelled is established. Therefore, the radiation level of the common mode noise is suppressed in the phase.

Next, in a phase in which the current amplitude of the common mode noise is the minimum (absolute value) on the side of the connector 37, the first conductive line 145 and the second conductive line 155 are short-circuited on the side of the connector 27. An approximate half-wavelength resonator is formed by the first conductive line 145 and the second conductive line 155, the high-frequency current of the common mode noise with the immediately previous phase flowing into the first conductive line 145 causes resonance in which the amplitude change of the high-frequency current is the maximum (peak) in the vicinity of the connector 27, the high-frequency current of the common mode noise in the phase can flow in the anti-parallel relation in the first conductive line 145 and the second conductive line 155 in the vicinity of the connector 27, and the relation in which the radiated electromagnetic fields generated from the first conductive line 145 and the second conductive line 155 are cancelled is established. Therefore, the radiation level of the common mode noise is suppressed.

At this time, the resistor 165 controls the inflow of the high-frequency current of the common mode noise into the second conductive line 155 and causes the high-frequency current of the common mode noise to flow in the first conductive line 145 in the connection section with the GND line 120. In the connection section with the second conductive line, the resistor 165 provides impedance so that the high-frequency current of the common mode noise flows easily to some extent from the short-circuited section of the first conductive line 145 and the second conductive line 155 to the second conductive line 155. Accordingly, the resistive value of the resistor 165 is preferably set to the extent that the impedance of the second conductive line 155 is not higher compared to the state of the open end. However, the resistive value of the resistor 165 can be changed by not only the impedance of the noise resource but also the frequency bandwidth of the noise for which the countermeasure is necessary. The resistive value of the resistor 165 can be appropriately determined when the actual noise countermeasure is executed.

The invention is not limited to the specific structure according to the fifth embodiment, but the signal line 110 may include a plurality of lines. That is, the signal line 110 may include a line or the like through which a clock signal serving as a reference signal of digital processing is transmitted. Further, a differential line or the like including two lines may be included. Further, the GND line or the power line may include a plurality of lines.

The first conductive line 145 and the second conductive line 155 are preferably disposed as a pair of lines to be adjacent the first GND line 120 at the outermost end portion in a direction perpendicular to the length direction of the flat cable 100. As described above, this is because the anti-parallel relation of the high-frequency current of the common mode noise is maximized and an operation of the radiated electromagnetic field generated by the second conductive line 155 through which the high-frequency current of the common mode noise rarely flows functions more effectively.

Qualitatively, the end portion of the one side of the second conductive line 155 on the side of the daughter board 30 becomes electrically high impedance. Therefore, the high-frequency current does not flow in a portion closer to the end portion, and thus the high-frequency magnetic field formed outside the second conductive line 155 is accordingly reduced. Therefore, the second conductive line 155 is preferably disposed in the outermost portion in the width direction with respect to the length direction of the flat cable 100 in which the resistance of the generation of the high-frequency magnetic field is small by another conductive line of the flat cable 100.

Next, the effect of the fifth embodiment examined using an electromagnetic field simulator will be described. As a simulation model, three lines formed of a copper foil with a thickness of 35 micrometers and having a width of 0.7 mm and a length of 150 mm are disposed parallel at an interval of 0.3 mm in the flat cable 100. That is, the lines are set as the first GND line 120, the first conductive line 145, and the second conductive line 155. The power line 130 and the signal line 110 are not shown to simplify the simulation model. Resin or the like added as an outer cover is not also shown.

The simulation model of the flat cable 100 is the same as that of the first embodiment in FIG. 3. That is, one pole of the signal source 60 which causes noise is connected to the first GND line 120 and the other pole of the signal source 60 is connected to a ground wall 50 of a simulation space set to be vertical to the flat cable 100. The wall surfaces other than the ground wall 50 are configured as electric field absorption walls 55. In this model, in the flat cable 100, the side of the signal source 60 is set as the side of the main board 20 and the opposite side is set as the side of the daughter board 30.

Further, the common mode is a mode regarding impedance of a signal source, but is originally a derivation of the normal mode and is considered to be basically a mode regarding high impedance. Since simulation conditions depend on the electric characteristics, the wiring structure, or the like in a connection section of each device, it is difficult to reach to a conclusion. However, 1 KΩ is set as one of the simulation conditions. On the other hand, the resistive value of the resistor 165 connected to the first and second conductive lines is changed to, for example, 100Ω, 500Ω, and 1 KΩ. Further, the setting of the resistive value is not confirmed, but is preferably determined actually with reference to the measurement result when the countermeasure of the radiated noise of the device is performed.

A proper load resistance has to be set also in the end portion of the flat cable 100 on the side of the daughter board 30 in addition to the above-mentioned condition. However, in this verification, the side of the flat cable 100 on the side of the daughter board 30 is set to be in an open state in which the level of an electromagnetic field radiated from the flat cable 100 is considered to be the worst. A problem with the radiation of an electromagnetic field does not occur in the original flat cable 100 under the basically matched load condition. Further, when resistance is present to some extent, an electromagnetic field is radiated while the energy of noise is lost, basically even in the mismatch state. Accordingly, the reason for setting the open state is that the worst condition is the open state in which the loss of the energy is assumed to be the smallest.

Figure 11:
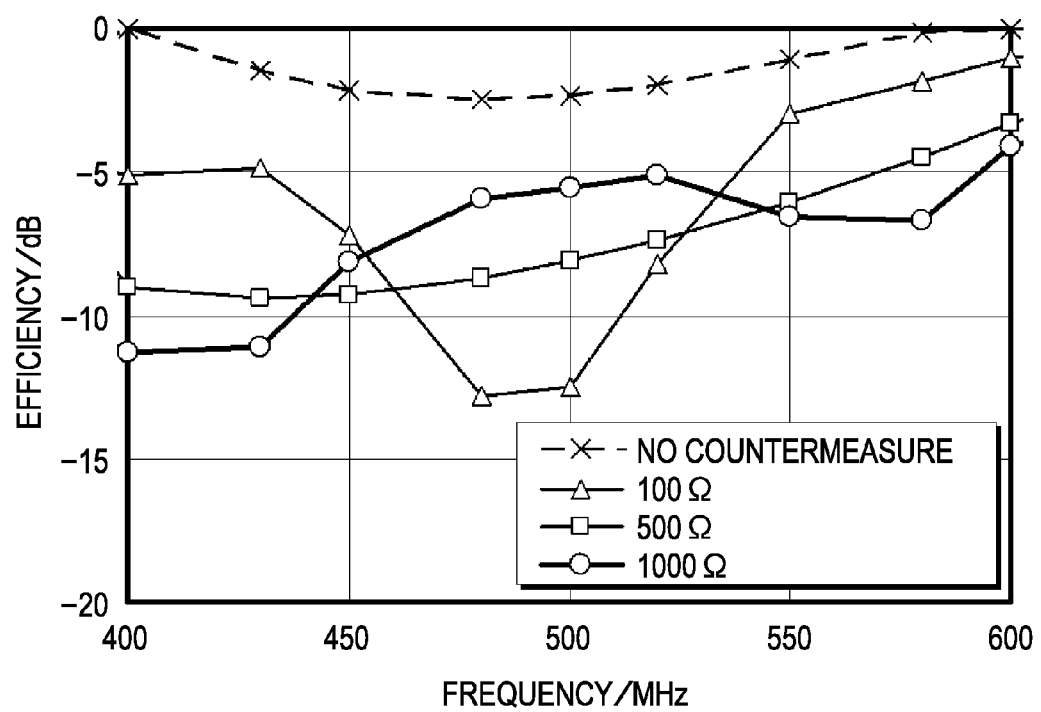
FIG. 11 is a diagram illustrating a radiation efficiency of a band near a frequency of 500 MHz according to the fifth embodiment.

As a result, as shown in FIG. 11, the situations of the radiated electromagnetic field in the simulation are as follows near 500 MHz which is approximately a quarter of the wavelength of the signal source.

1. When the first conductive line 145 and the second conductive line 155 of the flat cable 100 are not provided, an electromagnetic wave having a main polarized wave in the length direction is radiated to a space perpendicular to the length direction of the flat cable 100.

2. When the first and second conductive lines and the resistor 165 according to the fifth embodiment are provided, the radiation efficiency of the radiated electromagnetic field of the flat cable 100 is reduced in the 500 MHz band, compared to Situation 1.

3. It can be understood that the larger band in which the radiation efficiency of the flat cable 100 is reduced can be selected by changing the resistive value of the resistor 165.

As understood from the above-mentioned examination, according to the fifth embodiment, it is possible to reduce the level of the radiated electromagnetic field of the common mode noise flowing from the main board 20 to the daughter board 30 via the flat cable 100.

Sixth Embodiment

Figure 12:
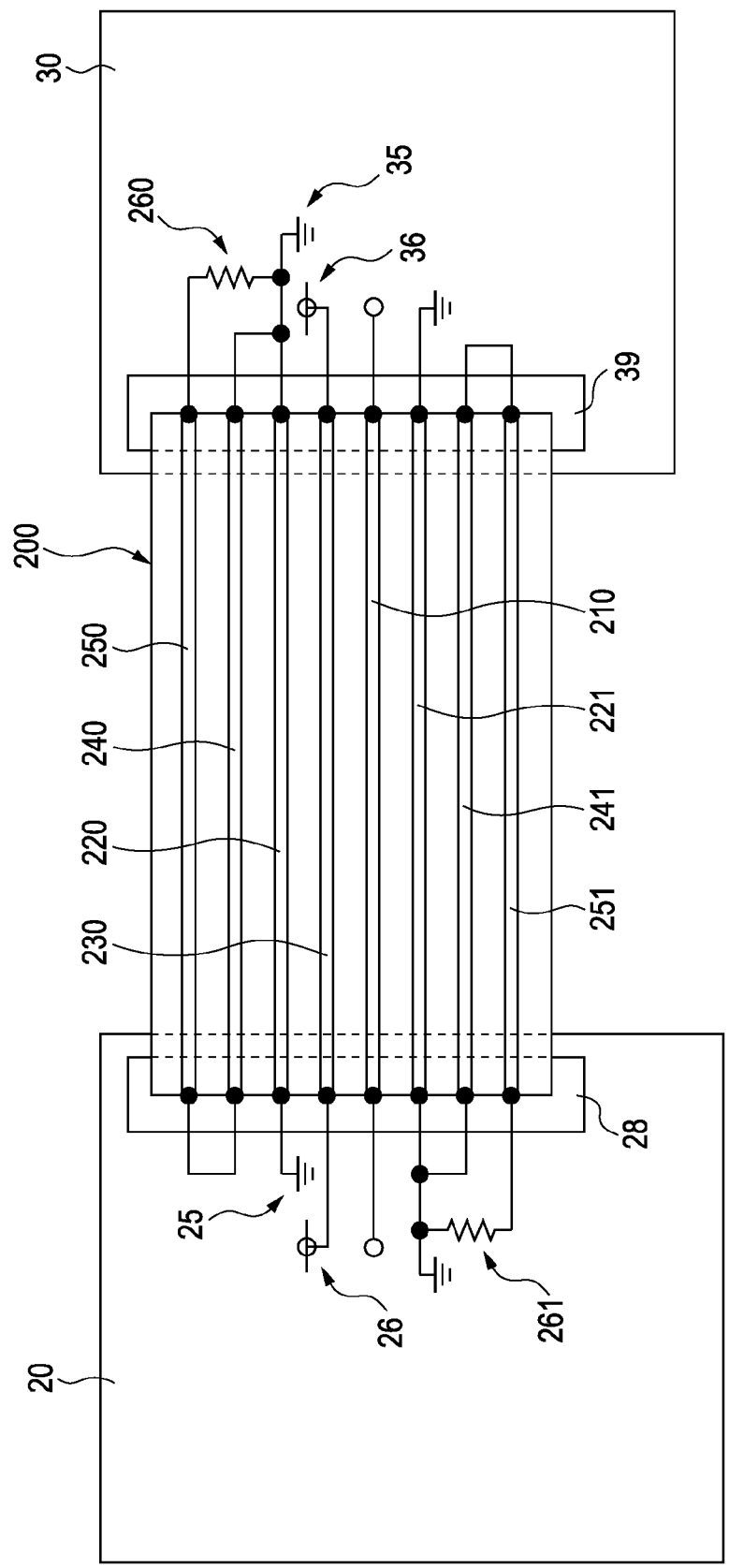
FIG. 12 is a diagram illustrating the structure of a flat cable according to a sixth embodiment.

Next, the structure of a flat cable 200 according to a sixth embodiment of the invention will be described with reference to FIG. 12. In the sixth embodiment, the flat cable 200 includes a signal line 210, a first GND line 220, a power line 230, and a second GND line 221 as wiring lines. The flat cable 200 further includes a first conductive line 240, a second conductive line 250, a third conductive line 241, and a fourth conductive line 251 in addition to the wiring lines. The widths of the lines are substantially the same as one another. The lines are arranged along the flat cable 200 substantially at the same interval and are fixed by a connector 28 of the main board 20 and a connector 39 of the daughter board 30 to be electrically connected to one another.

That is, the first GND line 220 and the second GND line 221 connect a GND electrode (ground electrode) 25 of the main board 20 to a GND electrode 35 of the daughter board 30. The power line 230 connects a power terminal 26 of the main board 20 to a power terminal 36 of the daughter board 30. The signal line 210 connects a signal terminal of the main board 20 to a signal terminal of the daughter board 30. A plurality of lines of each wiring line may be prepared to execute functions necessary in the main board 20 and the daughter board 30.

The end portion of one side of the first conductive line 240 is connected to the end portion of one side of the second conductive line 250 via a resistor 260 on the daughter board 30. The end portion of the one side of the first conductive line 240 is also electrically connected to the GND electrode 35 of the daughter board 30 or the end portion of the first GND line 220 on the side of the daughter board 30. Further, the end portion of the other side of the first conductive line 240 is electrically connected to the end portion of the other side of the second conductive line 250 on the side of the main board 20. A connection section is insulated directly and electrically from a circuit of the main board 20.

Further, the end portion of one side of the third conductive line 241 is connected to the end portion of one side of the fourth conductive line 251 via a resistor 261 on the main board 20. The end portion of the one side of the third conductive line 241 is also electrically connected to the GND electrode 25 of the main board 20 or the end portion of the second GND line 221 on the side of the main board 20. Further, the end portion of the other side of the third conductive line 241 is electrically connected to the end portion of the other side of the fourth conductive line 251 on the side of the daughter board 30. A connection section is insulated directly and electrically from a circuit of the daughter board 30.

In the sixth embodiment, a common mode noise source is assumed to be present in both the main board 20 and daughter board 30 and common mode noise is assumed to be transferred to both the main board 20 and the daughter board 30.

When the common mode noise is transferred in a direction from the main board 20 to the daughter board 30 or the common mode noise is transferred in the opposite direction, the high-frequency current of the common mode noise with the same phase flows along each of the signal line 210, the first GND line 220 and the power line 230, or the second GND line. At this time, when the length of the flat cable 200 is substantially the same as a quarter of the equivalent wavelength of the common mode noise to be targeted, an amplitude distribution of the high-frequency current of the common mode noise is noticeable in the wiring lines of the flat cable.

That is, when the length of the flat cable 200 is approximately a quarter of the equivalent wavelength of the common mode noise from a phase component relation of a component of the high-frequency current of the common mode noise from the connector 28 to the connector 39 and a component of the high-frequency current reflected from the connector 28 or 39 and a relation of the length of the flat cable 200, an amplitude change of the high-frequency current of the common mode noise is the maximum on the side of the connector 39 and the amplitude change of the high-frequency current of the common mode noise is the maximum on the side of the connector 28. The amplitude change is a difference between the maximum and the minimum of the absolute value of the amplitude caused due to a phase change of the high-frequency current. In regard to the behavior of the high-frequency current of the common mode noise, the radiation of the noise is suppressed by the following operation in the flat cable 200 according to the sixth embodiment.

First, in a phase in which the current amplitude of the common mode noise is the maximum (absolute value) on the side of the connector 39, the first GND line 220 and the first conductive line 240 are short-circuited on the side of the connector 39. Therefore, since the high-frequency current of the common mode noise can flow in an anti-parallel relation, a relation in which the radiated electromagnetic fields generated from the first GND line 220 and the first conductive line 240 are cancelled is established. Therefore, the radiation level of the common mode noise is suppressed in the phase.

Further, in a phase in which the current amplitude of the common mode noise is the minimum (absolute value) on the side of the connector 39, the first conductive line 240 and the second conductive line 250 are short-circuited on the side of the connector 28. An approximate half-wavelength resonator is formed by the first conductive line 240 and the second conductive line 250, the high-frequency current of the common mode noise with the immediately previous phase flowing into the first conductive line 240 causes resonance in which the amplitude change of the high-frequency current is the maximum (peak) in the vicinity of the connector 28, the high-frequency current of the common mode noise in the phase can flow in the anti-parallel relation in the first conductive line 240 and the second conductive line 250 in the vicinity of the connector 28, and the relation in which the radiated electromagnetic fields generated from the first conductive line 240 and the second conductive line 250 are cancelled is established. Therefore, the radiation level of the common mode noise is suppressed.

Next, in a phase in which the current amplitude of the common mode noise is the maximum (absolute value) on the side of the connector 28, the second GND line 221 and the third conductive line 241 are short-circuited on the side of the connector 28. Therefore, since the high-frequency current of the common mode noise can flow in an anti-parallel relation, a relation in which the radiated electromagnetic fields generated from the second GND line 221 and the third conductive line 241 are cancelled is established. Therefore, the radiation level of the common mode noise is suppressed in the phase.

Further, in a phase in which the current amplitude of the common mode noise is the minimum (absolute value) on the side of the connector 28, the third conductive line 241 and the fourth conductive line 251 are short-circuited on the side of the connector 28. An approximate half-wavelength resonator is formed by the third conductive line 241 and the fourth conductive line 251, the high-frequency current of the common mode noise with the previous phase flowing into the third conductive line 241 causes resonance in which the amplitude change of the high-frequency current is the maximum (peak) in the vicinity of the connector 39, the high-frequency current of the common mode noise in the phase can flow in the anti-parallel relation in the third conductive line 241 and the fourth conductive line 251 in the vicinity of the connector 39, and the relation in which the radiated electromagnetic fields generated from the third conductive line 241 and the fourth conductive line 251 are cancelled is established. Therefore, the radiation level of the common mode noise is suppressed.

At this time, the resistive values of the resistors 260 and 261 can be changed by not only the impedance of the noise resource but also the frequency bandwidth of the noise for which the countermeasure is necessary. The resistive values of the resistors 260 and 261 can be appropriately determined when the actual noise countermeasure is executed.

The invention is not limited to the specific structure according to the sixth embodiment, but the signal line 210 may include a plurality of lines. That is, the signal line 210 may include a line or the like through which a clock signal serving as a reference signal of digital processing is transmitted. Further, a differential line or the like including two lines may be included. Further, the GND line may include a plurality of lines. The first GND line 220 and the second GND line 221 shown in FIG. 12 may be the same line.

The first conductive line 240 and the second conductive line 250, and the third conductive line 241 and the fourth conductive line 251 are preferably disposed as a pair of lines to be adjacent the first GND line 220 and the second GND line 221, respectively, at the outermost end portion in a direction perpendicular to the length direction of the flat cable 200. As described above, this is because the anti-parallel relation of the high-frequency current of the common mode noise is maximized and an operation of the radiated electromagnetic field generated by the second conductive line 250 and the fourth conductive line 251 through which the high-frequency current of the common mode noise rarely flows functions more effectively.

Qualitatively, the end portion of the one side of the second conductive line 250 on the side of the daughter board 30 and the end portion of the one side of the fourth conductive line 251 on the side of the main board 20 become electrically high impedance. Therefore, the high-frequency current does not flow in a portion closer to each end portion, and thus the high-frequency magnetic fields formed outside the second conductive line 250 and the fourth conductive line 251 are accordingly reduced. Therefore, the second conductive line 250 and the fourth conductive line 251 are preferably disposed in the outermost portions in the width direction with respect to the length direction of the flat cable 200 in which the resistance of the generation of the high-frequency magnetic field is small by another conductive line of the flat cable 200.

Next, the effect of the sixth embodiment examined using an electromagnetic field simulator will be described. As a simulation model, five lines formed of a copper foil with a thickness of 35 micrometers and having a width of 0.7 mm and a length of 150 mm are disposed parallel at an interval of 0.3 mm in the flat cable 200. That is, the first GND line 220 and the second GND line 221 are used as one line, and a pair of the first conductive line 240 and the second conductive line 250 and a pair of the third conductive line 241 and the fourth conductive line 251 are disposed on both sides of the GND line.

The power line 230 and the signal line 210 are not shown to simplify the simulation model. Resin or the like added as an outer cover is not also shown. The simulation model of the flat cable 200 is the same as that of the first embodiment in FIG. 3. That is, one pole of the signal source which causes noise is connected to the GND line and the other pole of the signal source is connected to a ground wall 50 of a simulation space set to be vertical to the flat cable 200. The wall surfaces other than the ground wall 50 are configured as electric field absorption walls 55. In this model, in the flat cable 200, the side of the signal source is set as the side of the main board 20 or the daughter board 30 and the opposite side is set as the side of the daughter board 30 or the main board 20.

On the other hand, in the resistors 260 and 261, the impedance of the signal source is set to 1 KΩ as one of the simulation conditions, as described above. The resistive values of the resistors 260 and 261 are set to 1 KΩ. The resistive values of the resistors 260 and 261 are not confirmed, but are preferably determined actually with reference to the measurement result when the countermeasure of the radiated noise of the device is performed.

Figure 13:
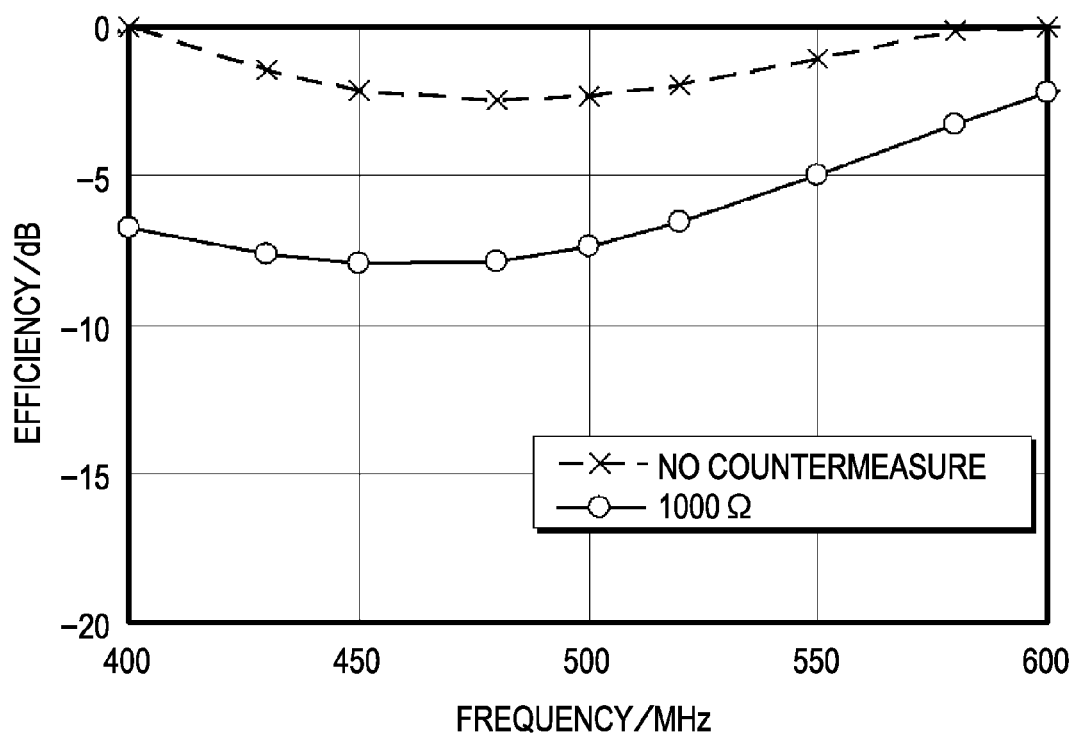
FIG. 13 is a diagram illustrating a radiation efficiency of a band near a frequency of 500 MHz according to the sixth embodiment.

As a result, as shown in FIG. 13, the situations of the radiated electromagnetic field in the simulation are as follows near 500 MHz which is approximately a quarter of the wavelength of the signal source.

1. When the first conductive line 240 and the second conductive line 250, and the third conductive line 241 and the fourth conductive line 251 of the flat cable 200 are not provided, an electromagnetic wave having a main polarized wave in the length direction is radiated to a space perpendicular to the length direction of the flat cable 200.

2. When the first conductive line 240, the second conductive line 250, and the resistor 260 are provided and the third conductive line 241, the fourth conductive line 251, and the resistor 261 are provided according to the sixth embodiment, the radiation efficiency of the flat cable 200 is reduced in the 500 MHz band, compared to Situation 1.

3. In the simulation model, the line arrangement shape of the signal source side and the opposite side, that is, the noise input and output sides is symmetric in the flat cable 200. Therefore, even when the input and output of the flat cable 200 is switched, the same characteristics are obtained. Accordingly, the radiated noise can be suppressed even when the common mode noise flows in from both end portions of the flat cable 200.

As understood from the above-mentioned examination, according to the sixth embodiment, it is possible to reduce the level of the radiated electromagnetic field of the common mode noise flowing from both the main board 20 and the daughter board 30 via the flat cable 200.

The first to sixth embodiments of the invention have been described with reference to the drawing. However, specific structures are not limited to the embodiments, but may be modified in design without departing from the gist of the invention. For example, the flat cable 100 has been used as the wiring member, but the invention is not limited thereto.

The wiring member connecting the main board 20 to the daughter board 30 configured inside the casing of an individual electronic apparatus has been described. However, the wiring member may not be provided in the casing, but may be provided to connect various electronic apparatuses to one another. For example, the wiring member is applicable when the wiring member connects a personal computer to a peripheral apparatus such as a mouse, a keyboard, or a display. Further, the wiring member is applicable to connect apparatuses such as a personal computer and a printer 10 or apparatuses such as a television and a recorder. Furthermore, even when a power module is provided outside an apparatus such as an AC adapter and an apparatus connected to the power module for use, the connection structure and the connection method are applicable to a power cable connecting the apparatus to the power module.

An apparatus realizing the above-described technique may be realized by a single apparatus or a combination of a plurality of apparatuses, and thus various aspects of the technique are included.

What is claimed is:

1. An electrical connection structure for a wiring member comprising:
   a main board;
   a daughter board; and
   a flat cable which electrically connects the main board and the daughter board;
   wherein the flat cable includes:
   a signal line which transfers signal and is electrically connected to the main board and the daughter board,
   a first conductive line which connects with a predetermined potential and connects the main board and the daughter board,
   a second conductive line which is arranged in one side portion of the flat cable, wherein the second conductive line includes:
   one end of the second conductive line is electrically connected to the first conductive line in the daughter board, and
   another end of the second conductive line which electrically isolates the main board, and
   a third conductive line, and wherein the third conductive line is arranged in an other side portion of the flat cable, and the third conductive line includes one end of the third conductive line which is electrically connected to the first conductive line in the main board, and another end of the third conductive line which electrically isolates the daughter board,
   wherein a high-frequency current which flows from the main board side to the daughter board side via the first conductive line flows from the daughter board side toward the main board by using the second conductive line and the third conductive line.

2. The electrical connection structure for a wiring member according to claim 1, wherein the first conductive line connects to a ground electrode.

3. The electrical connection structure for a wiring member according to claim 1, wherein the first conductive line connects to a power source.

4. The electrical connection structure for a wiring member according to claim 1, further comprising a fourth conductive line, wherein the fourth conductive line connects the main board and the daughter board, and connects with another predetermined potential.

5. The electrical connection structure for a wiring member according to claim 4, further comprising:
   a fifth conductive line,
   wherein the fifth conductive line is arranged in other side portion of the flat cable, and the fifth conductive line includes:
   one end of the fifth conductive line which is electrically connected to the fourth conductive line in the daughter board, and
   another end of the fifth conductive line which electrically isolates the main board,
   wherein the high-frequency current which flows from the main board end to the daughter board via the fourth conductive line flows from the daughter board side toward the main board using the fifth conductive line.

6. The electrical connection structure for a wiring member according to claim 4, further comprising a sixth conductive line,
wherein the sixth conductive line is arranged in other side portion of the flat cable,
the sixth conductive line includes:
one end of the sixth conductive line which is electrically connected to the fourth conductive line in the main board, and
another end of the sixth conductive line which electrically isolates the daughter board,
wherein the high-frequency current which flows from the daughter board to the main board via the fourth conductive line flows from the main board toward the daughter board using the sixth conductive line.

7. The electrical connection structure for a wiring member according to claim 1, wherein another end of the second conductive line is connected to the main board and extends toward the daughter board, the other side of the second conductive line electrically isolates the daughter board.

8. an electrical connection structure for a wiring member comprising:
a main board;
a daughter board; and
a flat cable which electrically connects the main board and the daughter board;
wherein the flat cable includes:
a signal line which transfers signal and electrically connects the main board and the daughter board,
a first conductive line which connects with a predetermined potential and connects the main board and the daughter board, and
a second conductive line, which includes:
one end of the second conductive line which is electrically connected to the first conductive line in a daughter board side, and
another end of the second conductive line which electrically isolates the main board, and
a third conductive line, and wherein the third conductive line is arranged in a side portion of the flat cable, and the third conductive line includes one end of the third conductive line which is electrically connected to the first conductive line in the main board, and another end of the third conductive line which electrically isolates the daughter board,
wherein a high-frequency current which flows from the main board to the daughter board via the first conductive line flows from the daughter board toward the main board using the second conductive line and the third conductive line.

9. an electrical connection structure for a wiring member comprising:
a main board;
a daughter board; and
a flat cable which electrically connects the main board and the daughter board;
wherein the flat cable includes:
a signal line which transfers signal and electrically connects the main board and the daughter board,
a first conductive line which connects a predetermined potential and connects the main board and the daughter board, and
a second conductive line which is arranged in one side portion of the flat cable, wherein the second conductive line includes:
one end of the second conductive line which is electrically connected to the first conductive line in the main board, and
another end of the second conductive line which electrically isolates the daughter board, and
a third conductive line, wherein the third conductive line is arranged in an other side portion of the flat cable, and the third conductive line includes:
one end of the third conductive line which is electrically connected to the first conductive line in the daughter board, and
another end of the third conductive line which electrically isolates the main board, and wherein a high-frequency current which flows from the daughter board to the main board side via the first conductive line flows from the main board toward the daughter board using the second conductive line and the third conductive line.

10. The electrical connection structure for a wiring member according to claim 9, wherein the first conductive line connects to a ground electrode.

11. The electrical connection structure for a wiring member according to claim 9, wherein the first conductive line connects to a power source.

12. The electrical connection structure for a wiring member according to claim 9, further comprising a fourth conductive line, wherein the fourth conductive line connects the main board and the daughter board, and connects with another predetermined potential.

13. The electrical connection structure for a wiring member according to claim 12, further comprising a fifth conductive line, wherein the fifth conductive line is arranged in other side portion of the flat cable, and the fifth conductive line includes:
one end of the fifth conductive line which is electrically connected to the fourth conductive line in the main board, and
another end of the fifth conductive line which electrically isolates the daughter board,
wherein the high-frequent current which flows from the daughter board to the main board via the fourth conductive line flows from the main board toward the daughter board using the fifth conductive line.

14. The electrical connection structure for a wiring member according to claim 12, further comprising a sixth conductive line, wherein the sixth conductive line is arranged in other side portion of the flat cable, and the sixth conductive line includes:
one end of the sixth conductive line which is electrically connected to the fourth conductive line in the daughter board, and
another end of the sixth conductive line which electrically isolates the main board,
wherein the high-frequent current which flows from the main board to the daughter board via the fourth conductive line flows from the daughter board toward the main board using the sixth conductive line.

15. The electrical connection structure for a wiring member according to claim 9, wherein the other end of the second conductive line is turned in the daughter board and extends toward the main board, and the other end of the second conductive line which electrically isolates the main board.

16. An electrical connection structure for a wiring member comprising:
a main board;
a daughter board; and
a flat cable which electrically connects the main board and the daughter board; wherein the flat cable includes:

a signal line which transfers signal and electrically connects the main board and the daughter board, a first conductive line which connects with a predetermined potential and connects between the main board and the daughter board, and a second conductive line which includes:

one end of the second conductive line electrically connected to the first conductive line in the main board side, and another end of the second conductive line which electrically isolates the daughter board, and a third conductive line, and wherein the third conductive line is arranged in a side portion of the flat cable, and the third conductive line includes one end of the third conductive line which is electrically connected to the first conductive line in the main board, and another end of the third conductive line which electrically isolates the daughter board, wherein a high-frequency current which flows from the daughter board to the main board side via the first conductive line flows from the main board toward the daughter board using the second conductive line and the third conductive line.

* * * * *